(12) United States Patent
Kim et al.

(10) Patent No.: US 9,389,469 B2
(45) Date of Patent: Jul. 12, 2016

(54) DISPLAY DEVICE

(71) Applicant: Samsung Display Co., Ltd., Yongin, Gyeonggi-Do (KR)

(72) Inventors: Won Tae Kim, Suwon-si (KR); Yu Jin Kim, Hwaseong-si (KR); Seon Uk Lee, Seongnam-si (KR); Kyung Tae Chae, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/519,899

(22) Filed: Oct. 21, 2014

(65) Prior Publication Data
US 2015/0346561 A1 Dec. 3, 2015

(30) Foreign Application Priority Data

May 27, 2014 (KR) ........................ 10-2014-0063770

(51) Int. Cl.
| | | |
|---|---|---|
| *H01L 27/12* | (2006.01) | |
| *G02F 1/1343* | (2006.01) | |
| *H01L 29/786* | (2006.01) | |
| *H01L 29/66* | (2006.01) | |
| *G02F 1/1368* | (2006.01) | |

(Continued)

(52) U.S. Cl.
CPC ........ *G02F 1/134309* (2013.01); *G02F 1/1341* (2013.01); *G02F 1/1368* (2013.01); *G02F 1/13458* (2013.01); *G02F 1/133345* (2013.01); *G02F 1/133377* (2013.01); *G02F 1/136286* (2013.01); *H01L 29/66742* (2013.01); *H01L 29/786* (2013.01); *G02F 2001/134318* (2013.01); *G02F 2001/136295* (2013.01); *H01L 27/124* (2013.01); *H01L 27/127* (2013.01); *H01L 27/1262* (2013.01)

(58) Field of Classification Search
CPC .. H01L 27/124; H01L 27/127; H01L 27/1262
See application file for complete search history.

(56) References Cited

U.S. PATENT DOCUMENTS 5,724,109 A * 3/1998 Nakamura .......... G02F 1/13476
349/106
7,167,225 B2 * 1/2007 Kim ...................... G02F 1/1393
349/111

(Continued)

FOREIGN PATENT DOCUMENTS

JP 2008-242150 A 10/2008
KR 10-2013-0124827 A 11/2013

(Continued)

*Primary Examiner* — Ida M Soward
(74) *Attorney, Agent, or Firm* — Innovation Counsel LLP

(57) ABSTRACT

A display device includes: a common voltage line formed on a display unit and at an outer side of the display unit; a first insulating layer formed on a thin film transistor on the display unit; a pixel electrode formed on the first insulating layer; a liquid crystal layer including a plurality of microcavities formed on the pixel electrode; a common electrode spaced apart from the pixel electrode with the liquid crystal layer interposed therebetween; the common electrode contacting the common voltage line at the outer side of the display unit through a contact hole; a second insulating layer formed on the common electrode; a roof layer formed on the second insulating layer; an injection hole formed on the common electrode, second insulating layer, and roof layer; and an overcoat formed on the roof layer covering the injection hole and sealing the microcavity, wherein the roof layer covers the contact hole.

11 Claims, 25 Drawing Sheets

(51) Int. Cl.
*G02F 1/1333* (2006.01)
*G02F 1/1341* (2006.01)
*G02F 1/1345* (2006.01)
*G02F 1/1362* (2006.01)

(56) References Cited

U.S. PATENT DOCUMENTS

| | | | | |
|---|---|---|---|---|
| 8,908,126 B2* | 12/2014 | Won | ................ | G02F 1/136286 349/139 |
| 9,151,976 B2* | 10/2015 | Yang | ................ | G02F 1/133377 |
| 2003/0133066 A1* | 7/2003 | Ono | ................ | G02F 1/134363 349/141 |
| 2011/0194062 A1* | 8/2011 | Lee | ................ | G02F 1/1339 349/149 |
| 2012/0154723 A1* | 6/2012 | Chang | ............... | G02F 1/133512 349/106 |
| 2012/0169985 A1* | 7/2012 | Kim | ................ | G02F 1/136227 349/139 |
| 2012/0169986 A1* | 7/2012 | Kwon | ................ | G02F 1/13452 349/139 |
| 2012/0199834 A1* | 8/2012 | Jeon | ................ | H01L 27/124 257/59 |
| 2012/0218501 A1* | 8/2012 | Lee | ................ | G02F 1/134309 349/139 |
| 2013/0188117 A1* | 7/2013 | Itou | ................ | G02F 1/133377 349/106 |
| 2013/0215344 A1* | 8/2013 | Kim | ................ | G02F 1/134309 349/41 |
| 2013/0267143 A1* | 10/2013 | Kim | ................ | G02F 1/1303 445/25 |
| 2014/0354921 A1* | 12/2014 | Lee | ................ | G02F 1/1341 349/89 |
| 2014/0375931 A1 | 12/2014 | Kim et al. | | |
| 2014/0375937 A1* | 12/2014 | Lee | ................ | H01L 29/66742 349/106 |
| 2015/0092143 A1* | 4/2015 | Cha | ................ | G02F 1/1341 349/106 |
| 2016/0054857 A1* | 2/2016 | Baek | ................ | G02F 1/133753 345/175 |
| 2016/0062159 A1* | 3/2016 | Lee | ................ | G02F 1/1341 349/43 |

FOREIGN PATENT DOCUMENTS

KR   10-2013-0129008 A   11/2013
KR   10-2015-0000215 A    1/2015

* cited by examiner

DISPLAY DEVICE

CROSS-REFERENCE TO RELATED APPLICATION

This application claims priority to and the benefit of Korean Patent Application No. 10-2014-0063770 filed in the Korean Intellectual Property Office on May 27, 2014, the entire contents of which are incorporated herein by reference.

BACKGROUND (a) Technical Field

The present disclosure relates to a display device and a manufacturing method thereof.

(b) Description of the Related Art

A liquid crystal display, which is one of the most common types of flat panel displays currently in use, typically includes two sheets of display panels with field generating electrodes (such as a pixel electrode and a common electrode) and a liquid crystal layer interposed therebetween. An electric field is generated in the liquid crystal display by applying a voltage to the field generating electrodes. The electric field determines the alignment of liquid crystal molecules of the liquid crystal layer and controls polarization of incident light, thereby displaying images.

The two sheets of display panels forming the liquid crystal display may include a thin film transistor array panel and an opposing display panel. In the thin film transistor array panel, a gate line for transferring a gate signal and a data line for transferring a data signal are formed crossing each other, and a thin film transistor connected with the gate line and the data line, a pixel electrode connected with the thin film transistor, and other components may be formed. In the opposing display panel, a light blocking member, a color filter, a common electrode, and other components may be formed. In some cases, the light blocking member, the color filter, and the common electrode may be formed on the thin film transistor array panel.

In a conventional liquid crystal display, two sheets of substrates are typically used, with the respective constituent elements formed on the two sheets of substrates. As a result, the conventional display device may be heavy and thick, expensive, and require long manufacturing time.

The above information disclosed in this Background section is only for enhancement of understanding of the background of the inventive concept and therefore it may contain information that does not form the prior art that is already known in this country to a person of ordinary skill in the art.

SUMMARY

The present disclosure addresses at least the above deficiencies in conventional display devices, by providing a display device having reduced weight, thickness, cost, and processing time. The above advantages can be achieved by manufacturing the display device using one substrate.

In addition, according to an exemplary method of manufacturing the display device, a roof layer can be used as a mask to reduce the number of masks in the manufacturing process. In particular, the roof layer can be formed covering the outer edge of the display unit to prevent short circuit of a common electrode. Also, a roof layer pattern can be formed over a pad conductor portion without requiring an additional process.

According to an exemplary embodiment of the inventive concept, a display device includes: a substrate; a common voltage line formed on a display unit and at an outer side of the display unit, wherein the display unit is formed on the substrate and includes a plurality of pixel areas; a thin film transistor formed on the display unit; a first insulating layer formed on the thin film transistor; a pixel electrode formed on the first insulating layer and connected to the thin film transistor; a liquid crystal layer including a plurality of microcavities formed on the pixel electrode; a common electrode formed spaced apart from the pixel electrode, wherein the liquid crystal layer is interposed between the common electrode and the pixel electrode; a contact hole formed on the common voltage line; the common electrode contacting the common voltage line at the outer side of the display unit through the contact hole; a second insulating layer formed on the common electrode; a roof layer formed on the second insulating layer; an injection hole formed on the common electrode, the second insulating layer, and the roof layer, wherein the injection hole partially exposes the microcavity in which the liquid crystal layer is disposed; and an overcoat formed on the roof layer covering the injection hole and sealing the microcavity, wherein the roof layer is disposed covering the contact hole.

In one embodiment, a pattern of the common electrode may be either the same as a pattern of the roof layer or located inside the pattern of the roof layer.

In one embodiment, one or more pads connected with a data line or a gate line of the display unit may be located in an area of the substrate where the display unit is formed, and an electrode may be exposed to an upper surface of the one or more pads.

In one embodiment, the common electrode may be formed in a shape of an inverse taper.

In one embodiment, a pattern of the second insulating layer may be either the same as a pattern of the roof layer or located inside the pattern of the roof layer.

In one embodiment, the second insulating layer may be formed in a shape of an inverse taper.

In one embodiment, a pixel electrode may be located in an uppermost surface of the one or more pads.

In one embodiment, the display device may further include a third insulating layer formed on the roof layer.

In one embodiment, a pattern of the common electrode may be located inside a pattern of the third insulating layer.

In one embodiment, a pattern of the second insulating layer may be located inside the pattern of the third insulating layer.

In one embodiment, the one or more pads may not be covered by the roof layer.

According to another exemplary embodiment of the inventive concept, a method of manufacturing a display device is provided. The method includes: forming a thin film transistor in a display unit of a substrate, and forming a pad conductor and a common voltage line at an outer area of the display unit; forming a first insulating layer on the thin film transistor and the pad conductor; forming a pixel electrode on the first insulating layer, wherein the pixel electrode is connected with the thin film transistor or the pad conductor; forming a sacrificial layer on the pixel electrode; forming a common electrode on the sacrificial layer; forming a second insulating layer on the common electrode; coating a roof layer material on the second insulating layer; patterning the roof layer material to form a roof layer and patterning the roof layer over the pad conductor to form a liquid crystal injection hole in the display unit; patterning the second insulating layer and the common electrode using the roof layer as a mask; forming a microcavity between the pixel electrode and the common electrode of the display unit by removing the sacrificial layer and by removing portions of the common electrode and the second insulating layer on the pad conductor; forming a liquid crystal layer by injecting a liquid crystal material into the microcavity; and sealing the microcavity by forming an overcoat on the roof layer.

In one embodiment, the pad conductor may be a gate line or a data line.

In one embodiment, patterning the roof layer material to form the roof layer and patterning the roof layer over the pad conductor to form the liquid crystal injection hole may be performed through a single process using a single mask.

In one embodiment, a pattern of the patterned roof layer may include a plurality of polygons, straight lines, curved lines, or wave lines.

In one embodiment, the common electrode may be formed in a shape of an inverse taper.

In one embodiment, the method of manufacturing the display device may further include ashing the sacrificial layer after patterning the second insulating layer and the common electrode.

In one embodiment, the roof layer may be patterned to cover a common voltage line.

In one embodiment, portions of the second insulating layer and the common electrode located on the sacrificial layer on the pad conductor may be lifted off and removed when removing the sacrificial layer.

In one embodiment, a pixel electrode may be located in an uppermost surface of the pad conductor.

According to the above exemplary embodiments of the inventive concept, the weight, thickness, cost, and processing time can be reduced by manufacturing the display device using one substrate.

In addition, since the second insulating layer and the common electrode can be patterned using the roof layer as a mask, the manufacturing process can be simplified.

In addition, the roof layer may be formed covering the outer edge area of the display unit so that a short circuit of the common electrode and the common voltage line can be prevented. Further, since the roof layer pattern may be formed on the pad conductor portion, the pad conductor portion can be formed without requiring an additional process.

DETAILED DESCRIPTION

Figure 1:
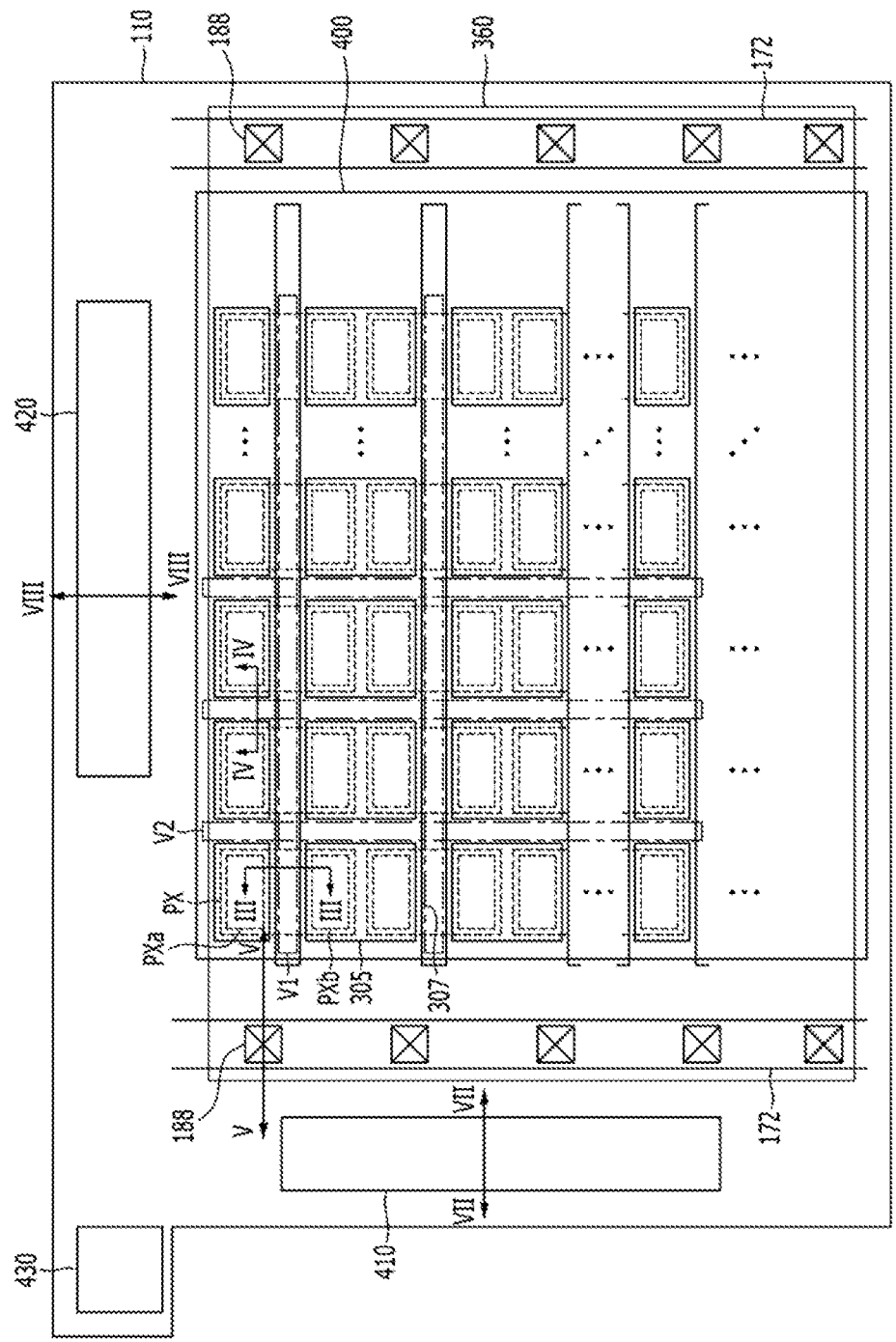
FIG. 1 is a top plan view of a display device according to an exemplary embodiment of the inventive concept.

The inventive concept will be described more fully herein with reference to the accompanying drawings, in which exemplary embodiments are shown. As those skilled in the art would realize, the described embodiments may be modified in various ways without departing from the spirit or scope of the inventive concept.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be disposed directly on the other element or with one or more intervening elements being present. In contrast, when an element is referred to as being "directly on" another element, there are no intervening elements present.

A display device according to different exemplary embodiments of the inventive concept will be described with reference to the accompanying drawings.

FIG. 1 is a top plan view of a display device according to an exemplary embodiment of the inventive concept. In the interest of clarity, only some of the constituent elements of the display device are illustrated in FIG. 1.

Referring to FIG. 1, a display device 500 according to the exemplary embodiment of the inventive concept includes a substrate 110 and a roof layer 360 formed on the substrate 110. The substrate 110 may be made of a material such as glass or plastic.

A display unit 400 and pad portions 410, 420, and 430 are formed on the substrate 110. Specifically, a plurality of pixels are formed on the display unit 400 and an image can be displayed by the display unit 400. The pad portions 410, 420, and 430 are formed at an external edge of the display unit 400 and are connected with the respective gate lines and data lines. Each pad portion is connected with a gate line and a data line of each pixel in the display unit 400, and transmits a gate voltage and a data voltage.

A gate pad 410 is formed at a side surface of the display unit 400, and is connected with a gate line of a pixel formed in the display unit 400.

A data pad 420 is formed at a side surface of the display unit 400, and is connected with a data line of a pixel formed in the display unit 400.

An exposure pad 430 may be connected with a gate line and a data line of a pixel, and is used to apply a voltage for forming a pre-tilt in an alignment layer. In some instances, the exposure pad 430 may be omitted, or may be removed after a manufacturing process of the display device.

Common voltage lines 172 for applying a voltage to a common electrode are formed at an external edge of the display unit 400. A plurality of contact holes 188 are formed on the common voltage line 172, and the common voltage line 172 and a common electrode (not shown) are disposed in contact with each other through the contact holes 188. The common voltage line 172 is connected with a common voltage supply and receives a common voltage. The common voltage supplied to the common voltage line 172 is transmitted to the common electrode (not shown) through the contact holes 188. Accordingly, the common voltage is transmitted to a common electrode of each pixel in the display unit 400.

In the drawings, the contact holes 188 are illustrated as being formed at both sides of the display unit 400. In some other embodiments, the contact holes 188 may be formed only at one of the left and right sides of the display unit 400. The number of contact holes may be adjusted according to the size of the display unit 400.

The display unit 400 includes a plurality of pixel areas PX. The plurality of pixel areas PX include a plurality of pixel rows and a plurality of pixel columns and are arranged in a matrix format. Each pixel area PX may include a first sub-pixel area PXa and a second sub-pixel area PXb. The first sub-pixel area PXa and the second sub-pixel area PXb may be vertically disposed.

A first valley V1 may be positioned between the first sub-pixel area PXa and the second subpixel area PXb in a pixel row direction, and a second valley V2 may be positioned between the plurality of pixel columns.

The roof layer 360 may be formed along the plurality of pixel rows. In the above embodiment, an injection hole 307 is formed in the first valley V1 so that constituent elements below the roof layer 360 may be exposed to the outside (by removing the roof layer 360).

Each roof layer 360 is separated from the substrate 110 between neighboring second valleys V2 such that a microcavity 305 is formed. In addition, each roof layer 360 covers lateral side surfaces of the microcavity 305 by attaching to the substrate 110 in the second valley V2.

In the present exemplary embodiment, the roof layer 360 covers the display unit 400, the common voltage line 172, and the contact hole 188. Generally, in a conventional display device, the roof layer of the display device is formed only above the pixel area. However, in the exemplary embodiment of the inventive concept, the roof layer 360 also covers external areas of the display area 400 (that is, the common voltage line 172 and the contact line 188), so that a short circuit of a common electrode 270 can be prevented. The shape and effect of the roof layer 360 according to the inventive concept will be described in detail later in the specification.

It should be noted that the structure described in the above embodiment is merely exemplary, and that the structure can be modified in various ways. For example, the alignment of the pixel area PX, the first valley V1, and second valley V2 may be changed, the plurality of roof layers 360 may be connected with each other, and a part of each roof layer 360 may be separated from the substrate 110 in the second valley V2 such that neighboring microcavities 305 may be connected with each other.

Next, a pixel of the display unit in the display device according to the exemplary embodiment of the inventive concept will be described with reference to FIG. 1 to FIG. 4.

Figure 2:
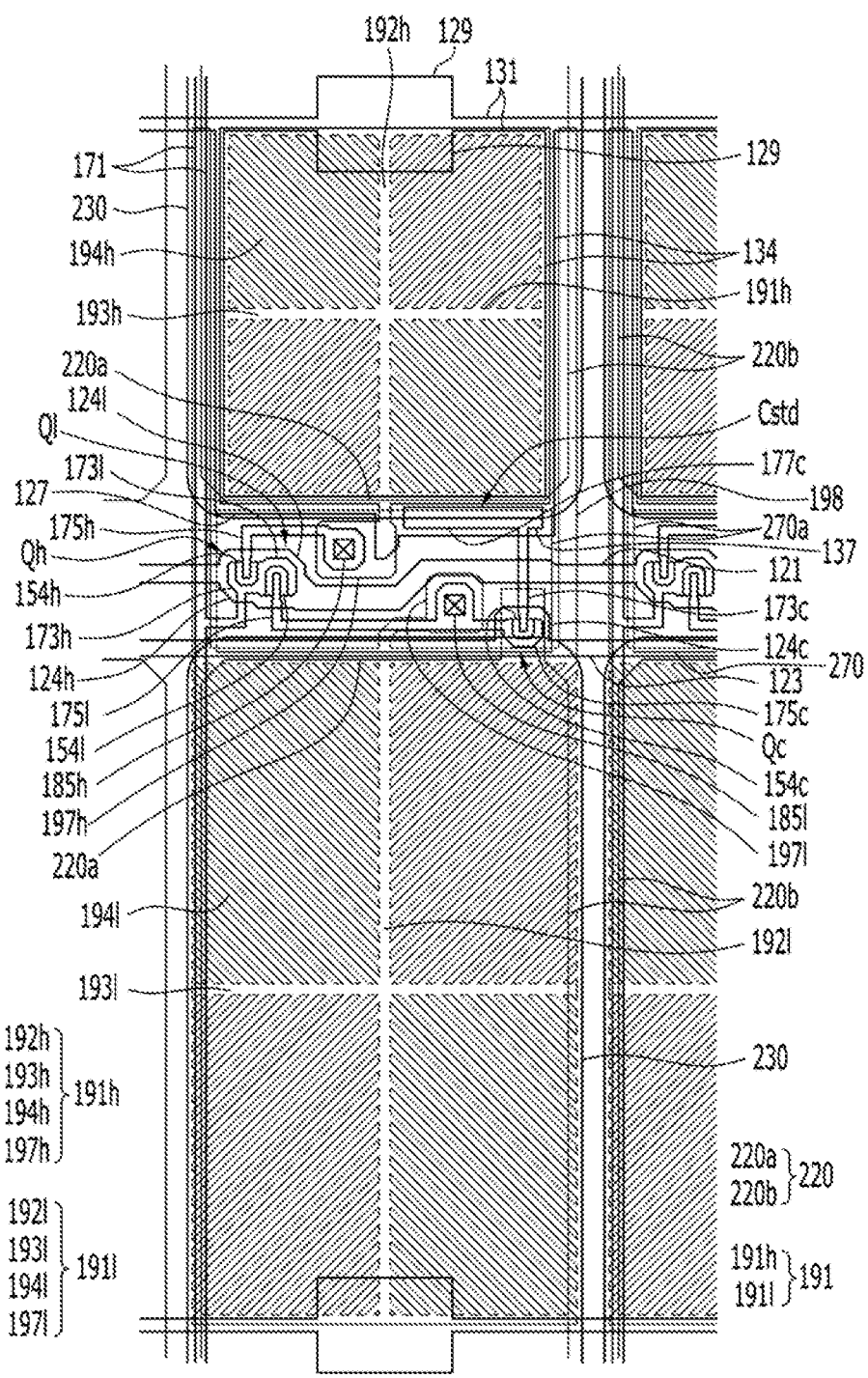
FIG. 2 is a top plan view of a pixel of the display device of FIG. 1.
Figure 3:
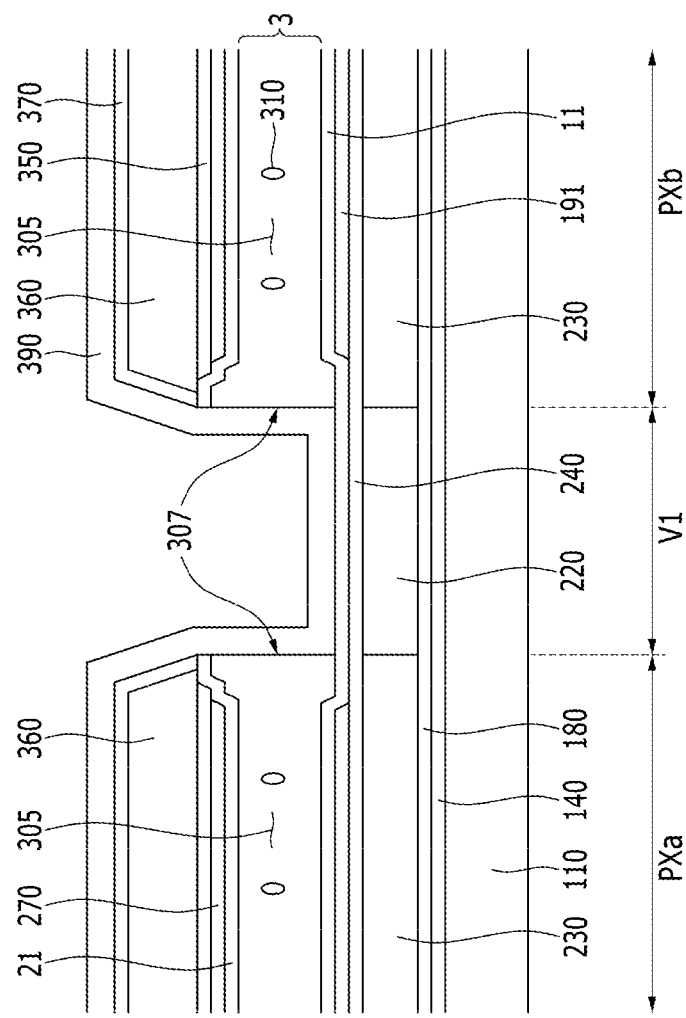
FIG. 3 is a cross-sectional view of the display device of FIG. 1 taken along line III-III.
Figure 4:
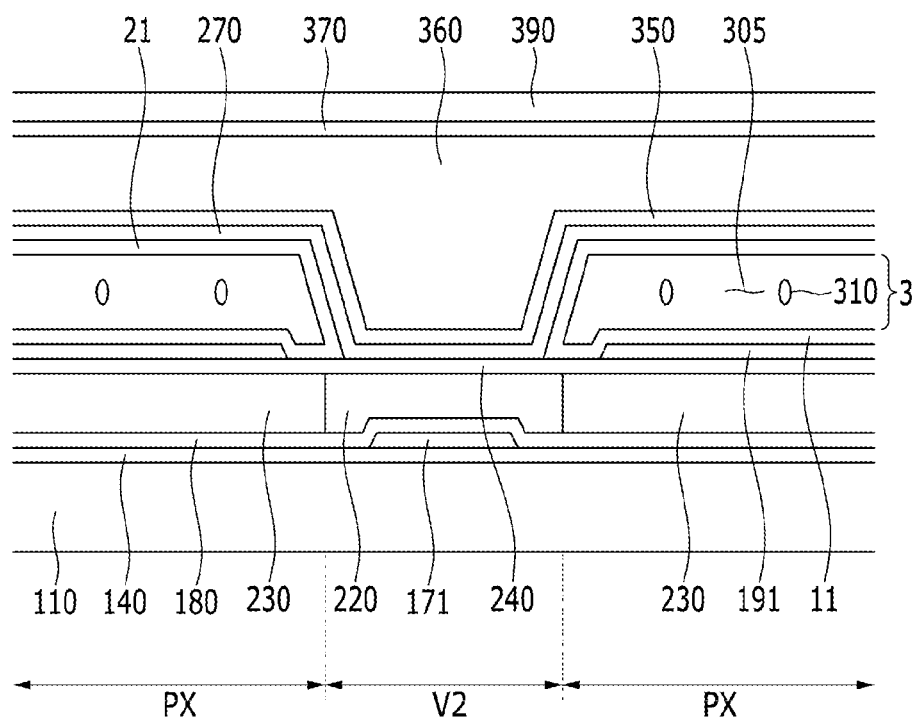
FIG. 4 is a cross-sectional view of the display device of FIG. 1 taken along line IV-IV.

FIG. 2 is a top plan view of a pixel of the display device of FIG. 1. FIG. 3 is a cross-sectional view of the display device of FIG. 1 taken along line III-III. FIG. 4 is a cross-sectional view of the display device of FIG. 1 taken along line IV-IV.

Referring to FIG. 1 to FIG. 4, a plurality of gate conductors including a plurality of gate lines 121, a plurality of step-down gate lines 123, and a plurality of storage electrode lines 131 are formed on the substrate 110.

The gate lines 121 and the step-down gate lines 123 extend in a substantially horizontal direction and transmit a gate signal. The gate conductors further include a first gate electrode 124h and a second gate electrode 124l protruding upward and downward respectively from the gate line 121, and a third gate electrode 124c protruding upward from the step-down gate line 123. The first gate electrode 124h and the second gate electrode 124l are connected with each other to form a protrusion. The protruding shape/direction of the first, second, and third gate electrodes 124h, 124l, and 124c may be modified by those skilled in the art.

The storage electrode line 131 extends in a substantially horizontal direction and transfers a predetermined voltage (such as a common voltage Vcom). The storage electrode line 131 includes storage electrodes 129 protruding upward and downward, a pair of vertical portions 134 extending downward to be substantially perpendicular to the gate line 121, and a horizontal portion 127 connecting the ends of the pair of vertical portions 134. The horizontal portion 127 includes a capacitor electrode 137 extending downward.

A gate insulating layer 140 is formed on the gate conductors (121, 123, 124h, 124l, 124c, and 131). The gate insulating layer 140 may be made of an inorganic insulating material such as a silicon nitride (SiNx) or a silicon oxide (SiOx). Further, the gate insulating layer 140 may be formed as a single layer or a multilayer structure.

A first semiconductor 154h, a second semiconductor 154l, and a third semiconductor 154c are formed on the gate insulating layer 140. The first semiconductor 154h may be positioned on the first gate electrode 124h, the second semiconductor 154l may be positioned on the second gate electrode 124I, and the third semiconductor 154c may be positioned on the third gate electrode 124c. The first semiconductor 154h and the second semiconductor 154l may be connected to each other, and the second semiconductor 154l and the third semiconductor 154c may be connected to each other. Further, the first semiconductor 154h may extend to the lower portion of a data line 171. The first to third semiconductors 154h, 154l, and 154c may be made of amorphous silicon, polycrystalline silicon, a metal oxide, and the like.

Ohmic contact members (not illustrated) may be further formed on the first to third semiconductors 154h, 154l, and 154c, respectively. The ohmic contact members may be made of a silicide or a material such as n+ hydrogenated amorphous silicon (in which an n-type impurity is doped at a high concentration).

A data conductor (including the data line 171, a first source electrode 173h, a second source electrode 173l, a third source electrode 173c, a first drain electrode 175h, a second drain electrode 175l, and a third drain electrode 175c) is formed on the first to third semiconductors 154h, 154l, and 154c.

The data line 171 transfers a data signal and extends in a substantially vertical direction crossing the gate line 121 and the step-down gate line 123. Each data line 171 includes a first source electrode 173h and a second source electrode 173l extending toward (and connected with) the first gate electrode 124h and the second gate electrode 124l, respectively.

Each of the first drain electrode 175h, the second drain electrode 175I, and the third drain electrode 175c includes a wide end portion and a rod-shaped end portion. The rod-shaped end portions of the first drain electrode 175h and the second drain electrode 175l are partially surrounded by the first source electrode 173h and the second source electrode 173l, respectively. The wide end portion of the second drain electrode 175l is further extended to form the third source electrode 173c which is bent in a shape of the letter 'U'. The wide end portion 177c of the third drain electrode 175c overlaps with the capacitive electrode 137 to form a step-down capacitor Cstd, and the rod-shaped end portion of the third drain electrode 175c is partially surrounded by the third source electrode 173c.

The first gate electrode 124h, the first source electrode 173h, and the first drain electrode 175h, together with the first semiconductor 154h, collectively constitute a first thin film transistor Qh. The second gate electrode 124I, the second source electrode 173I, and the second drain electrode 175I, together with the second semiconductor 154I, collectively constitute a second thin film transistor QI. The third gate electrode 124c, the third source electrode 173c, and the third drain electrode 175c, together with the third semiconductor 154c, collectively constitute a third thin film transistor Qc.

In the first semiconductor 154h, an exposed portion (which is not covered by the first source electrode 173h and the first drain electrode 175h) is disposed between the first source electrode 173h and the first drain electrode 175h. In the second semiconductor 154I, an exposed portion (which is not covered by the second source electrode 173I and the second drain electrode 175I) is disposed between the second source electrode 173I and the second drain electrode 175I. In the third semiconductor 154c, an exposed portion (which is not covered by the third source electrode 173c and the third drain electrode 175c) is disposed between the third source electrode 173c and the third drain electrode 175c.

A passivation layer 180 is formed on the data conductors (171, 173h, 173l, 173c, 175h, 175l, and 175c) and on the exposed portions of the semiconductors 154h, 154l, and 154c between the respective source electrodes 173h/173l/173c and the respective drain electrodes 175h/175l/175c. The passivation layer 180 may be made of an organic insulating material or an inorganic insulating material, and may be formed as a single layer or a multilayer structure.

A color filter 230 is formed in each pixel area PX on the passivation layer 180. Each color filter 230 may display one of the primary colors (such as the three primary colors red, green, and blue). However, the color filter 230 is not limited to the three primary colors red, green, and blue, but may also display cyan, magenta, yellow, and white-based colors. In some embodiments (not illustrated), the color filter 230 may be elongated in a column direction along a space between adjacent data lines 171. The color filter 230 may be made of an organic material.

A light blocking member 220 is formed in a region between adjacent color filters 230. The light blocking member 220 is formed on a boundary of the pixel area PX and the thin film transistor to prevent light leakage. The color filter 230 is formed in each of the first subpixel area PXa and the second subpixel area PXb, and the light blocking member 220 may be formed between the first subpixel area PXa and the second subpixel area PXb.

The light blocking member 220 includes a horizontal light blocking member 220a extending along the gate line 121 and the step-down gate line 123 extending both upward and downward, and a vertical light blocking member 220b extending along the data line 171. The light blocking member 220 covers regions in which the first thin film transistor Qh, the second thin film transistor Ql, and the third thin film transistor Qc are positioned. That is, the horizontal light blocking member 220a may be formed at the first valley V1, and the vertical light blocking member 220b may be formed at the second valley V2. The color filter 230 and the light blocking member 220 may overlap with each other in a partial region.

A first insulating layer 240 may be further formed on the color filter 230 and the light blocking member 220. The first insulating layer 240 may be made of an inorganic insulating material such as a silicon nitride (SiNx), a silicon oxide (SiOx), a silicon oxynitride (SiOxNy) and the like. The first insulating layer 240 serves to protect the color filter 230 and the light blocking member 220. In some particular embodiments, the first insulating layer 240 may be omitted.

The light blocking member 220, the passivation layer 180, and a plurality of first contact holes 185h and a plurality of second contact holes 185l (exposing the wide end portion of the first drain electrode 175h and the wide end portion of the second drain electrode 175l, respectively) are formed on the first insulating layer 240.

A pixel electrode 191 is formed on the first insulating layer 240. The pixel electrode 191 may be made of a transparent metal material such as indium tin oxide (ITO) or indium zinc oxide (IZO).

The pixel electrode 191 includes a first subpixel electrode 191h and a second subpixel electrode 191l separated from each other with the gate line 121 and the step-down gate line 123 disposed therebetween. The first subpixel electrode 191h and the second subpixel electrode 191l are disposed above and below the pixel area PX with reference to the gate line 121 and the step-down gate line 123 so as to be adjacent to each other in a column direction. That is, the first subpixel electrode 191h and the second subpixel electrode 191l are separated from each other with the first valley V1 disposed therebetween, the first subpixel electrode 191h is positioned in the first subpixel area PXa, and the second subpixel electrode 191l is positioned in the second subpixel area PXb.

The first subpixel electrode 191h and the second subpixel electrode 191l are connected with the first drain electrode 175h and the second drain electrode 175l through the first contact hole 185h and the second contact hole 185l, respectively. Accordingly, when the first thin film transistor Qh and the second thin film transistor Ql are turned on, the first subpixel electrode 191h and the second subpixel electrode 191l receive data voltages from the first drain electrode 175h and the second drain electrode 175l.

Each of the first subpixel electrode 191h and the second subpixel electrode 191l is shaped as a quadrangle, and the first subpixel electrode 191h and the second subpixel electrode 191l include cross stems including horizontal stems 193h and 193l and vertical stems 192h and 192l crossing the horizontal stems 193h and 193l, respectively. Further, the first subpixel electrode 191h and the second subpixel electrode 191l include a plurality of minute branches 194h and 194l, and protrusions 197h and 197l protruding downward or upward from edge sides of the subpixel electrodes 191h and 191l, respectively.

The pixel electrode 191 is divided into four subregions by the horizontal stems 193h and 193l and the vertical stems 192h and 192l. The minute branches 194h and 194l extend obliquely from the horizontal stems 193h and 193l and the vertical stems 192h and 192l at an angle of approximately 45 degrees or 135 degrees with the gate line 121 or the horizontal stems 193h and 193l. Further, the minute branches 194h and 194l of two adjacent subregions may extend perpendicular to each other.

In the exemplary embodiment, the first subpixel electrode 191h further includes an outer stem surrounding the outside of the first subpixel electrode 191h, and the second subpixel electrode 191I further includes horizontal portions positioned at an upper end and a lower end of the second subpixel electrode 191I, and left and right vertical portions 198 positioned at the left and the right of the first subpixel electrode 191h. The left and right vertical portions 198 may prevent capacitive coupling between the data line 171 and the first subpixel electrode 191h.

It should be noted that the layout of the pixel area, the structure of the thin film transistor, and the shape of the pixel electrode described above are merely exemplary, and that the inventive concept is not limited thereto and may be modified in various ways.

The common electrode 270 is formed on the pixel electrode 191 so as to be spaced apart from the pixel electrode 191 at a predetermined distance. The microcavity 305 is formed between the pixel electrode 191 and the common electrode 270. That is, the microcavity 305 is surrounded by the pixel electrode 191 and the common electrode 270. A width and an area of the microcavity 305 may be modified according to a size and a resolution of the display device.

The common electrode 270 may be made of a transparent metal material such as indium tin oxide (ITO) or indium zinc oxide (IZO). A predetermined voltage may be applied to the common electrode 270, and an electric field may be generated between the pixel electrode 191 and the common electrode 270.

A first alignment layer 11 is formed on the pixel electrode 191. The first alignment layer 11 may be formed directly above the first insulating layer 240 in an area that is not covered by the pixel electrode 191.

A second alignment layer 21 is formed below the common electrode 270 facing the first alignment layer 11.

The first alignment layer 11 and the second alignment layer 21 may be formed by vertical alignment layers, and may be made of alignment materials such as polyamic acid, polysiloxane, or polyimide. The first and second alignment layers 11 and 21 may be connected to each other at an edge of the pixel area PX.

A liquid crystal layer 3 comprising liquid crystal molecules 310 includes a plurality of microcavities 305 positioned between the pixel electrode 191 and the common electrode 270. The liquid crystal molecules 310 have negative dielectric anisotropy, and may align in a vertical direction on the substrate 110 in the absence of an electric field. That is, vertical alignment may be performed when an electric field is not applied.

The first subpixel electrode 191h and the second subpixel electrode 191l (to which the data voltages are applied) generate an electric field together with the common electrode 270. The electric field determines the directions of the liquid crystal molecules 310 positioned in the microcavity 305 between the electrodes 191 and 270. The luminance of light passing through the liquid crystal layer varies according to the directions of the liquid crystal molecules 310.

A second insulating layer 350 may be further formed on the common electrode 270. The second insulating layer 350 may be made of an inorganic insulating material such as a silicon nitride (SiNx), a silicon oxide (SiOx), a silicon oxynitride (SiOxNy), and the like. In some particular embodiments, the second insulating layer 350 may be omitted.

The roof layer 360 is formed on the second insulating layer 350. The roof layer 360 may be made of an organic material. The microcavity 305 is formed below the roof layer 360, and the roof layer 360 is hardened by a curing process to maintain the shape of the microcavity 305. The roof layer 360 is spaced apart from the pixel electrode 191 with the microcavity 305 disposed therebetween.

The roof layer 360 is formed in each pixel area PX along a pixel row and the second valley V2, and is not formed in the first valley V1. That is, the roof layer 360 is not formed between the first subpixel area PXa and the second subpixel area PXb. The microcavity 305 is formed below each roof layer 360 at each of the first subpixel area PXa and the second subpixel area PXb. In the second valley V2, the microcavity 305 is not formed below the roof layer 360, but is attached to the substrate 110. Accordingly, a thickness of the roof layer 360 positioned at the second valley V2 may be greater than a thickness of the roof layer 360 positioned at each of the first subpixel area PXa and the second subpixel area PXb. The upper surface and both sides of the microcavity 305 are covered by the roof layer 360.

The injection hole 307 exposing a part of the microcavity 305 is formed in the common electrode 270, the second insulating layer 350, and the roof layer 360. Injection holes 307 may be formed facing each other at the edges of the first subpixel area PXa and the second subpixel area PXb. That is, the injection hole 307 may be formed exposing the sides of the microcavity 305 corresponding to a lower side surface of the first sub-pixel area PXa, that is, an upper side surface of the second sub-pixel area PXb. Since the microcavity 305 is exposed by the injection hole 307, an aligning agent, a liquid crystal material, or the like may be injected into the microcavity 305 through the injection hole 307.

The common electrode 270, the second insulating layer 350, and the roof layer 360 have similar patterns. This is because the second insulating layer 350 and the common electrode 270 are patterned using the roof layer 360 as a mask. However, the pattern of the common electrode 270, the pattern of the second insulating layer 350, and the pattern of the roof layer 360 may be different from one another near the injection hole 307.

As shown in FIG. 3, the patterns of the common electrode 270 may be similar to the pattern of the roof layer 360 or may be located inside of the pattern of the roof layer 360. That is, a part of the roof layer 360 does not overlap the common electrode 270 at an edge of the roof layer 360. In this case, the edge of the common electrode 270 may be formed in the shape of an inverse taper.

In addition, the pattern of the second insulating layer 350 may be located inside of the pattern of the roof layer 360. In this case, the edge of the second insulating layer 350 may be formed in the shape of an inverse taper.

In addition, although not illustrated in FIG. 3, the edge of the roof layer 360, the edge of the second insulating layer 350, and the edge of the common electrode 270 may not match. That is, the side surfaces of the roof layer 360, the second insulating layer 350, and the common electrode 270 may be respectively connected with one another so that a plane may be formed.

A third insulating layer 370 may be further formed on the roof layer 360. The third insulating layer 370 may be made of an inorganic insulating material such as a silicon nitride (SiNx), a silicon oxide (SiOx), a silicon oxynitride (SiOxNy), and the like. The third insulating layer 370 may cover an upper surface and a side surface of the roof layer 360. The third insulating layer 370 protects the roof layer 360. The roof layer 360 may be made of an organic material.

The third insulating layer 370 is also formed with a pattern similar to that of the common electrode 270, the second insulating layer 350, and the roof layer 360. However, the pattern of the common electrode 270, the pattern of the second insulating layer 350, and the pattern of the roof layer 360 may be different from one another near the injection hole 307.

The pattern of the common electrode 270 may be located in an inner side of the pattern of the roof layer 360. Similarly, the pattern of the second insulating layer 350 (as shown in FIG. 3) may be located in an inner side of the pattern of the third insulating layer 370.

Although the above embodiment is described having a structure in which the third insulating layer 370 is formed on the roof layer 360, the inventive concept is not limited thereto. In some particular embodiments, the third insulating layer 370 may be omitted.

An overcoat 390 may be formed on the third insulating layer 370. The overcoat 390 is formed covering the injection hole 307 where a part of the microcavity 305 is exposed to the outside. That is, the overcoat 390 may seal the microcavity 305 so that the liquid crystal molecules 310 disposed in the microcavity 305 are not discharged to the outside. Since the overcoat 390 contacts the liquid crystal molecules 310, the overcoat 390 may be made of a material which does not react with liquid crystal molecules 310. For example, the overcoat 390 may be made of parylene and the like.

The overcoat 390 may be formed as a multilayer structure such as a double layer or a triple layer. The double layer includes two layers made of different materials. The triple layer includes three layers, and the materials of adjacent layers are different from each other. For example, the overcoat 390 may include a layer made of an organic insulating material and a layer made of an inorganic insulating material.

Although not illustrated, polarizers may be further formed on upper and lower surfaces of the display device. The polarizers may include a first polarizer and a second polarizer. The first polarizer may be attached onto the lower surface of the substrate 110, and the second polarizer may be attached onto the overcoat 390.

Figure 5:
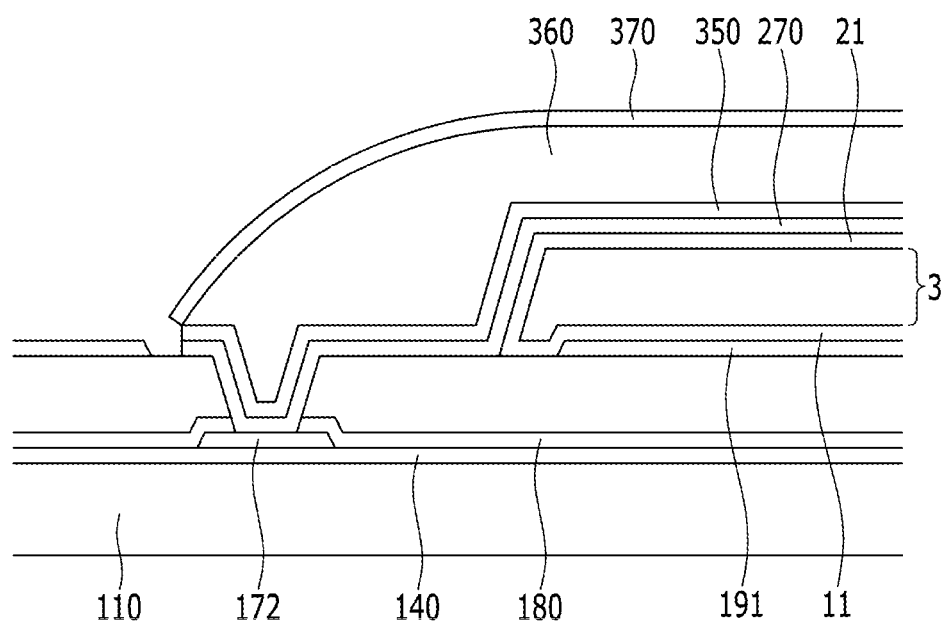
FIG. 5 is a cross-sectional view of the display device of FIG. 1 taken along line V-V.
Figure 6:
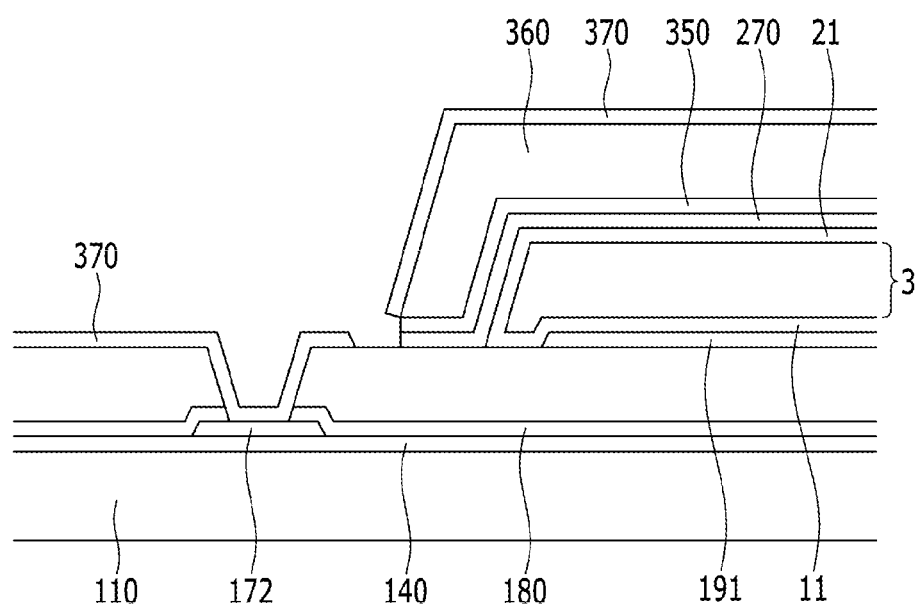
FIG. 6 is a cross-sectional view of a conventional display device, and illustrates the same cross-section area as in FIG. 5.

Next, referring to FIG. 1, FIG. 5, and FIG. 6, an outer edge structure of the display unit of the display device according to the exemplary embodiment of the inventive concept will be described. FIG. 5 is a cross-sectional view of the display device of FIG. 1 taken along line V-V. FIG. 6 is a cross-sectional view of a display device according to another embodiment of the inventive concept, and illustrates the same cross-section as in FIG. 5.

As shown in FIG. 1, the common electrode 270 formed in a pixel of the display unit 400 contacts the common voltage line 172 located at an outer edge of the display unit 400, and receives a common voltage. As shown in FIG. 1 and FIG. 5, in the display device according to the exemplary embodiment of the inventive concept, the roof layer 360 covers the common voltage line 172 and the contact hole 188 since the roof layer 360 is formed at the outer edge of the display unit 400.

Referring to FIG. 5, the common electrode 270, the second insulating layer 350, the roof layer 360, and the third insulating layer 370 are formed on the common voltage line 172. In some particular embodiments, the third insulating layer 370 may be omitted.

As shown in FIG. 5, the edge of the roof layer 360 matches the edge of the second insulating layer 350 and the edge of the common electrode 270. Alternatively, the edge of the second insulating layer 350 may be located inside the edge of the roof layer 360, and the edge of the common electrode 270 may have an inverse taper shape when it is further located inside the edge of the common electrode 270. In the display device of the present exemplary embodiment, the roof layer is located on the common electrode 270 at an outer edge of the display unit 400 and a contact portion of the common voltage line 172 so that a short circuit of the common electrode 270 can be prevented.

In the exemplary embodiment of the inventive concept, in the display device in which the roof layer 360, the second insulating layer 350, and the common electrode 270 have similar patterns, the second insulating layer 350 and the common electrode 270 may be etched using the roof layer 360 as a mask. However, in a conventional display device in which the roof layer 360 is located only in the display unit region, the common electrode 270 above the common voltage line 172 is also etched, which may cause a short circuit.

FIG. 6 is a cross-sectional view of a conventional display device, and illustrates the same cross-section area as in FIG. 5. Specifically, FIG. 6 shows a display device in which a roof layer 360 is formed only in a display unit area. Referring to FIG. 6, the pattern of the roof layer 360, the pattern of a second insulating layer 350, and the pattern of a common electrode 270 are the same such that the common electrode 270 is not connected to the common voltage line 172. Therefore, the common electrode 270 in FIG. 6 does not receive a common voltage from the common voltage line 172.

However, a short circuit in the conventional display device of FIG. 6 may occur when the second insulating layer 350 and the common electrode 270 are etched using the roof layer 360 as a mask (to reduce the number of masks in the manufacturing process). In contrast to the conventional display device, the roof layer 360 in the exemplary display device is formed on the outer side of the display unit and as a result, the common electrode 270 is not short circuited even when a lower structure is etched using the roof layer 360 as a mask.

Next, referring to FIG. 1, FIG. 7, and FIG. 8, a pad portion structure of the display device according to the exemplary embodiment of the inventive concept will be described.

Figure 7:
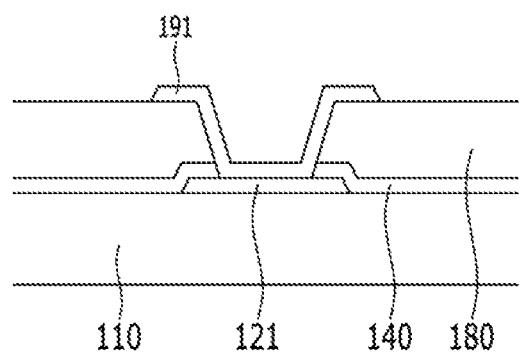
FIG. 7 is a cross-sectional view of the display device of FIG. 1 taken along line VII-VII.

FIG. 7 is a cross-sectional view of the display device of FIG. 1 taken along line VII-VII. FIG. 8 is a cross-sectional view of the display device of FIG. 1 taken along line VIII-VIII.

Figure 10:
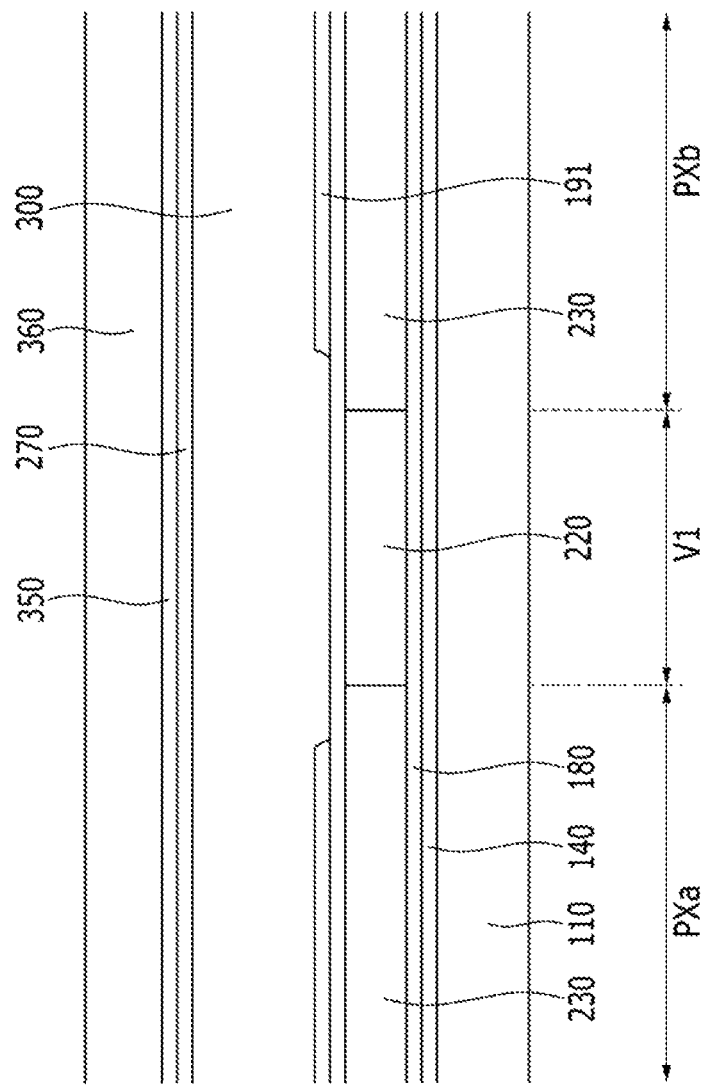

Referring to FIG. 1, the gate pad 410 (that receives the gate voltage and supplies the received gate voltage and the data pad 420) may be located at an outer edge of the display unit. Although not illustrated in FIG. 1, the gate pad 410 of FIG. 10 is connected with a gate line of a pixel in the display unit 410, and the data pad 420 is connected with a data line of a pixel in the display unit 400. In addition, an exposure pad 430 may be located at one side of the display unit 400, and the exposure pad 430 may be connected with a gate line and a data line of each pixel and may be used to apply a voltage for forming a pre-tilt in an alignment layer. The exposure pad 430 may be removed after forming the pre-tilt in the alignment layer.

Such a pad contacts another supply means that supplies a voltage, and an electrode provided in an upper surface of the pad should be exposed for the contact. Since each pad is formed through the same process as the display unit, a layering structure of the pad is similar to a layering structure of the display unit 400.

Referring to FIG. 7, a gate line 121, a gate insulating layer 140, and a passivation layer 180 are formed in the gate pad 410, and the gate insulating layer 140 and the passivation layer 180 are formed on the gate line 121. In addition, contact holes exposing the gate line 121 are formed in the gate insulating layer 140 and the passivation layer 180. Through the contact holes, the pixel electrode 191 is connected with the gate line 121. The pixel electrode 191 is an electrode that contacts with an external voltage supply. The gate line 121 of the gate pad is connected with a gate line of each pixel, and a voltage supplied through contact between the external voltage supply and the pixel electrode 191 is transmitted to each pixel of the display unit 400 through the gate line 121.

Accordingly, the pixel electrode 191 needs to be exposed to be in contact with the external voltage supply.

Similarly, the data pad includes a gate line 171, a passivation layer 180 formed on the data line, and a pixel electrode 191 formed on the passivation layer 180, and the pixel electrode 191 and the data line 171 contact each other through a contact hole formed in the passivation layer 180. The pixel electrode 191 may be an electrode that contacts with an external data voltage supply, and a voltage supplied through the contact between the external data voltage supply and the pixel electrode 191 is transmitted to each pixel of the display unit 400 through the data line 171. Accordingly, the pixel electrode 191 needs to be exposed to be in contact with the external data voltage supply.

Figure 8:
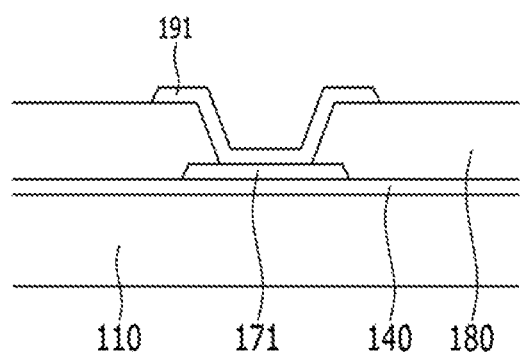
FIG. 8 is a cross-sectional view of the display device of FIG. 1 taken along line VIII-VIII.

Referring to FIG. 7 and FIG. 8, in the exemplary embodiment of the inventive concept, the pixel electrode 191 is not covered by other elements (e.g. a roof layer), and therefore the pixel electrode 191 is exposed. However, the second insulating layer 350 and the common electrode 270 are etched using the roof layer 360 as a mask so that the edge of the roof layer 360, the edge of the second insulating layer 350, and the edge of the common electrode 27 may match each other. Thus, the second insulating layer 350, the common electrode 270, and the roof layer 360 located on the pixel electrode 191 of the pad cannot be easily removed.

As previously mentioned, according to the present exemplary embodiment of the display device, no additional constituent elements are formed on the pixel electrode 191 of the pad portion.

Next, a method for manufacturing a display device according to an exemplary embodiment of the inventive concept will be described with reference to FIG. 9 to FIG. 29, and also FIG. 1 to FIG. 8.

FIG. 9 to FIG. 15 and FIG. 23 to FIG. 29 are cross-sectional views of a display device at different stages of manufacture according to the exemplary method of manufacturing the display device. Specifically, FIG. 9 to FIG. 12, FIG. 14, FIG. 23, FIG. 25, and FIG. 27 to FIG. 29 are cross-sectional views taken along the same cross-section line as in FIG. 3 at different stages of the manufacturing process. FIG. 13, FIG. 15, FIG. 24, and FIG. 26 are cross-sectional views taken along the same cross-section line as in FIG. 7 at different stages of the manufacturing process.

Figure 9:
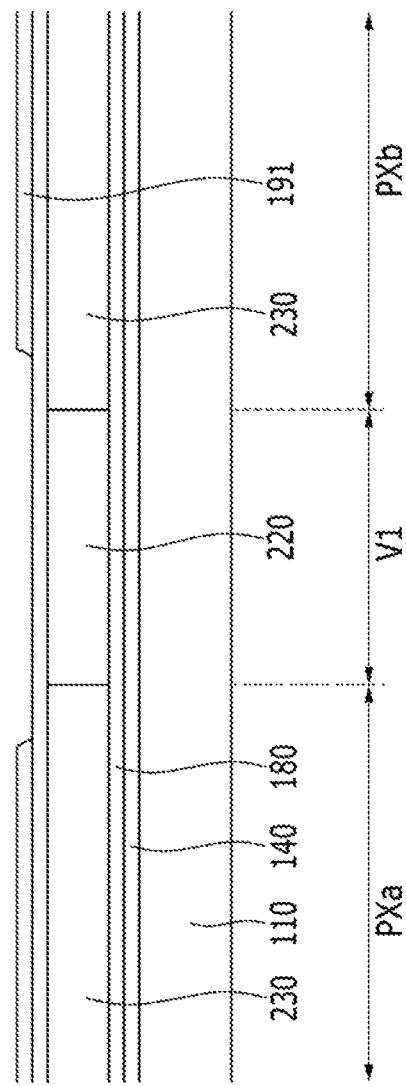
FIG. 9 to FIG. 15 and FIG. 23 to FIG. 29 are cross-sectional views of a display device at different stages of manufacture according to an exemplary method of manufacturing the display device.
Figure 13:
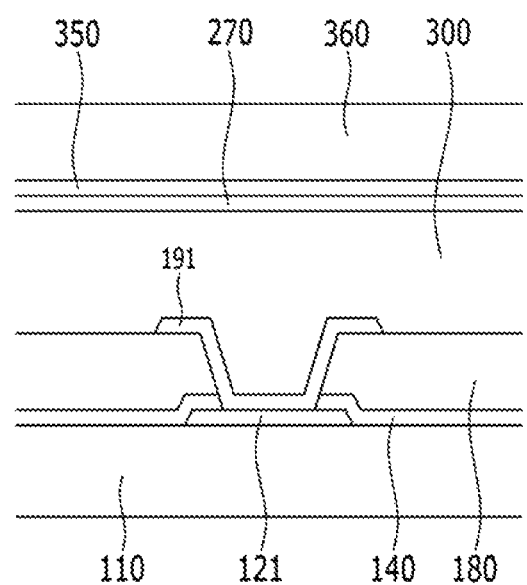

First, as shown in FIG. 9 and FIG. 13, a gate line 121 extending in one direction and a step-down gate line 123 are formed on a substrate 110. The substrate 110 may be made of glass or plastic. A first gate electrode 124$h$, a second gate electrode 124$l$, and a third gate electrode 124$c$ are formed protruding from the gate line 121.

In addition, a storage electrode 131 may be formed at a distance from the gate line 121, the step-down gate line 123, and the first to third gate electrodes 124$h$, 124$l$, and 124$c$.

Next, a gate insulating layer 140 is formed on the entire surface of the substrate 110 over the gate line 121, the step-down gate line 123, the first to third gate electrodes 124$h$, 124$l$, and 124$c$, and the storage electrode line 131. The gate insulating layer 140 is made of an inorganic insulating material such as a silicon oxide (SiOx) or a silicon nitride (SiNx). The gate insulating layer 140 may be formed as a single layer or a multilayer structure.

Next, a semiconductor material (such as amorphous silicon, polycrystalline silicon, a metal oxide, and the like) is deposited onto the gate insulating layer 140, and the semiconductor material is then patterned to form a first semiconductor 154$h$, a second semiconductor 154$l$, and a third semiconductor 154$c$. The first semiconductor 154$h$ may be disposed on the first gate electrode 124$h$, the second semiconductor 154$l$ may be disposed on the second gate electrode 124$l$, and the third semiconductor 154$c$ may be disposed on the third gate electrode 124$c$.

Next, a metal material is deposited and then patterned to form a data line 171 extending in the other direction (perpendicular to the gate line 121). The metal material may be formed as a single layer or a multilayer structure.

A first source electrode 173$h$ protruding above the first gate electrode 124$h$ from the data line 171 and a first drain electrode 175$h$ spaced apart from the first source electrode 173$h$ are formed together. In addition, a source electrode 173$l$ connected with the first source electrode 173$h$ and a second drain electrode 173$l$ spaced apart from the second source electrode 173$l$ are formed together. Further, a third source electrode 173$c$ extending from the second drain electrode 175$l$ and a third drain electrode 175$c$ spaced apart from the third source electrode 173$c$ are formed together.

After sequential deposition of the semiconductor material and the metal material, the two materials may be simultaneously patterned to form the first to third semiconductors 154$h$, 154$l$, and 154$c$, the data line 171, the first to third source electrodes 173$h$, 173$l$, and 173$c$, and the first to third drain electrodes 175$h$, 175$l$, and 175$c$. In this case, the first semiconductor 154$h$ is formed extending to the lower portion of the data line 171.

The first, second, and third gate electrodes 124$h$, 124$l$, and 124$c$, the first, second, and third source electrodes 173$h$, 173$l$, 173$c$, and the first, second, and third drain electrodes 175$h$, 175$l$, 175$c$, together with the first, second, and third semiconductors 154$h$, 154$l$, and 154$c$, collectively constitute the first, second, and third thin film transistors (TFTs) Qh, Ql, and Qc, respectively.

Next, a passivation layer 180 is formed on the portions of the semiconductors 154$h$, 154$l$, and 154$c$ that are exposed between the data line 171, the first to third source electrodes 173$h$, 173$l$, and 173$c$, the first to third drain electrodes 175$h$, 175$l$, and 175$c$, the respective source electrodes 173$h$, 173$l$, and 173$c$, and the respective drain electrodes 175$h$, 175$l$, and 175$c$. The passivation layer 180 may be made of an organic insulating material or an inorganic insulating material, and may be formed as a single layer or a multilayer structure.

Next, a color filter 230 is formed in each pixel area PX on the passivation layer 180. Each color filter 230 is formed in a first sub-pixel area PXa and a second sub-pixel area PXb, and may not be formed in a first valley V1. In addition, color filters 230 having the same color may be formed in a column direction of the plurality of pixel areas PX. When forming color filters 230 having three different colors, a first colored color filter 230 may first be formed and then a second colored color filter 230 may be formed by shifting a mask. After the second colored color filter 230 is formed, a third colored color filter may be formed by shifting a mask.

Next, a light blocking member 220 is formed on a boundary of each pixel area PX on the passivation layer 180 and the thin film transistor. The light blocking member 220 may be formed at the first valley V1 positioned between the first subpixel area PXa and the second subpixel area PXb.

In the above embodiment, the light blocking member 220 is formed after forming the color filters 230. However, the inventive concept is not limited thereto. In some other embodiments, the light blocking member 220 may be formed before forming the color filters 230.

Next, a first insulating layer 240 is formed on the color filter 230 and the light blocking member 220. The first insulating layer 240 is made of an inorganic insulating material such as a silicon nitride (SiNx), a silicon oxide (SiOx), or a silicon oxynitride (SiOxNy).

Next, a first contact hole 185$h$ is formed by etching the passivation layer 180, the light blocking member 220, and the first insulating layer 240 so as to expose a part of the first drain electrode 175$h$, and a second contact hole 185$l$ is formed so as to expose a part of the second drain electrode 175$l$.

Subsequently, a first subpixel electrode 191$h$ is formed in the first subpixel area PXa and a second subpixel electrode 191$l$ is formed in the second subpixel area PXb. The first subpixel electrode 191$h$ and the second subpixel electrode 191$l$ are formed by depositing and then patterning a transparent metal material such as indium tin oxide (ITO) or indium zinc oxide (IZO) on the first insulating layer 240. The first subpixel electrode 191$h$ and the second subpixel electrode 191$l$ are separated from each other with the first valley V1 disposed therebetween. The first subpixel electrode 191$h$ is connected with the first drain electrode 175$h$ through the first contact hole 185h, and the second subpixel electrode 191l is connected with the second drain electrode 175l through the second contact hole 185l.

Horizontal stems 193h and 193l and vertical stems 192h and 192l crossing the horizontal stems 193h and 193l are formed at the first subpixel electrode 191h and the second subpixel electrode 191l, respectively. Further, a plurality of minute branches 194h and 194l are formed extending obliquely from the horizontal stems 193h and 193l and the vertical stems 192h and 192l.

A process similar to the above is performed for the gate pad and the data pad. Referring to FIG. 13, in the gate pad, a gate line 121, a gate insulating layer 140, a passivation layer 180, a contact hole 188, and a pixel electrode 191 are formed using steps similar to those in the above-described manufacturing process.

Next, as illustrated in FIG. 10, a sacrificial layer 300 is formed by coating a photosensitive organic material on the pixel electrode 191 and performing a photolithography process.

The sacrificial layer 300 is formed covering each pixel area PX.

The sacrificial layer 300 is not only formed on the display area where pixels are formed, but also on the entire surface of the substrate 110 of FIG. 1. Thus, referring to FIG. 13, the sacrificial layer 300 is also formed on the pixel electrode of the gate pad. Although not illustrated, the sacrificial layer may be formed on a data pad, an exposure pad, or other pads.

Figure 11:
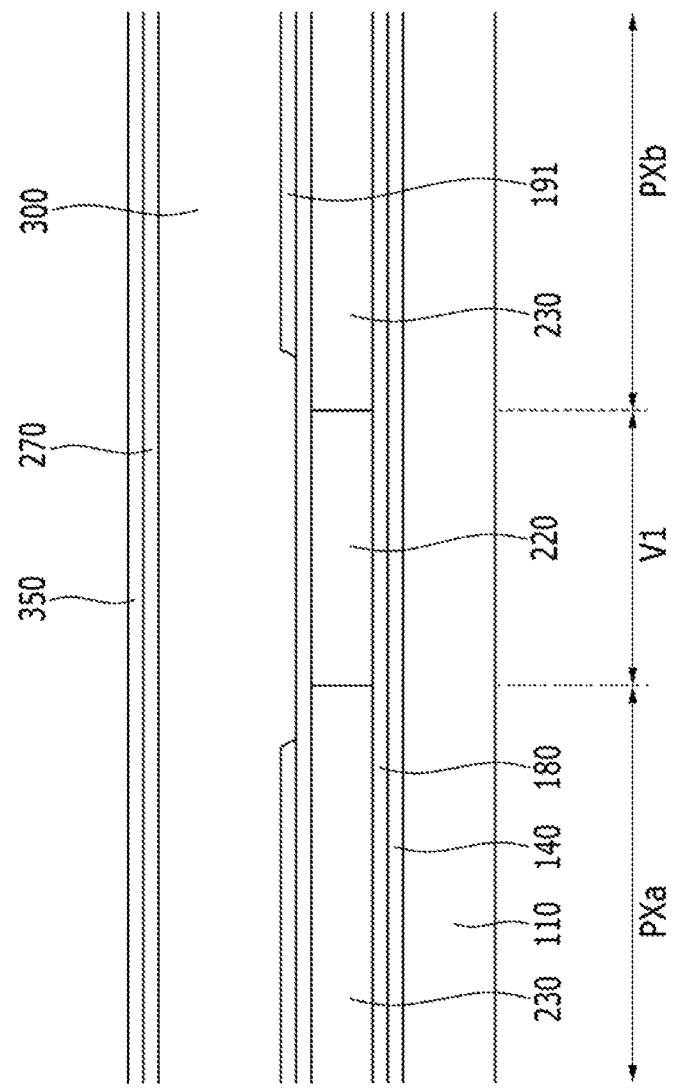

As illustrated in FIG. 11, the common electrode 270 is then formed by depositing a transparent metal material such as indium tin oxide (ITO) or indium zinc oxide (IZO) on the sacrificial layer 300.

The second insulating layer 350 may be formed on the common electrode 270. The second insulating layer 350 may be made of an inorganic insulating material such as a silicon nitride (SiNx), a silicon oxide (SiOx), or a silicon oxynitride (SiOxNy).

Figure 12:
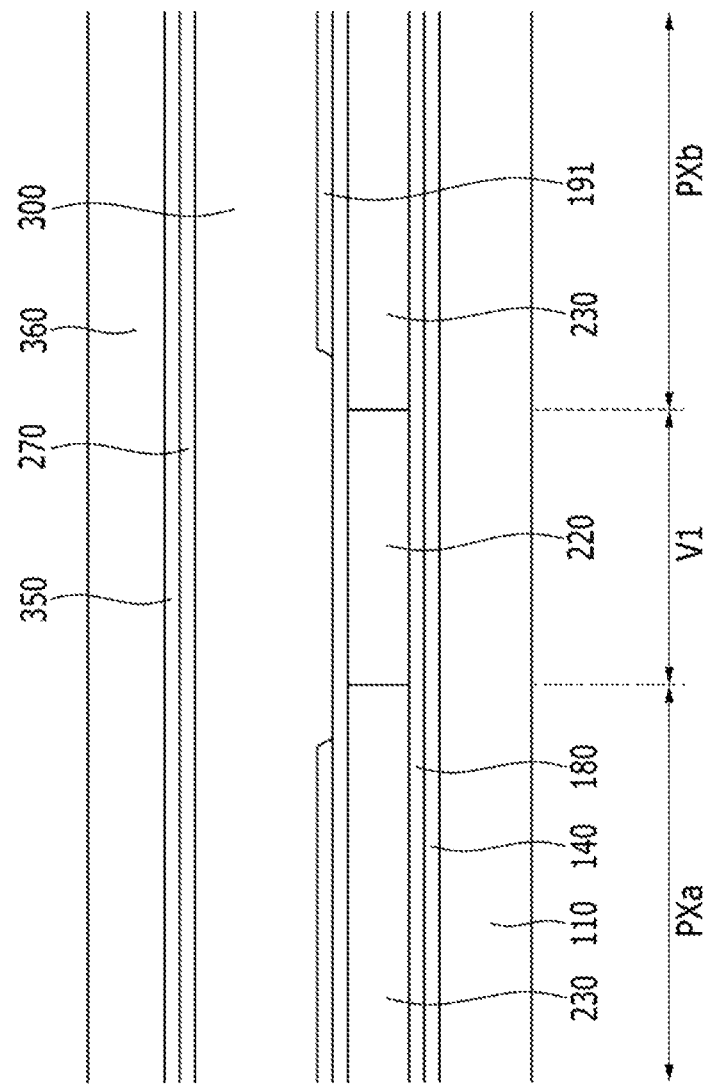

Next, referring to FIG. 12, the roof layer 360 is formed by coating and patterning an organic material on the second insulating layer 350. The roof layer 360 is not only located in the display unit area where pixels are disposed, but is also located on the entire surface of the substrate 110 of FIG. 1. Thus, a material of the roof layer 360 is coated over the common voltage line 172, the gate pad 410, and the upper surface of the data pad 420 located at the outer edge of the display unit.

Referring to FIG. 13, the sacrificial layer 300, the common electrode 270, the second insulating layer 350, and the roof layer 360 are disposed on the pixel electrode of the gate pad.

Figure 14:
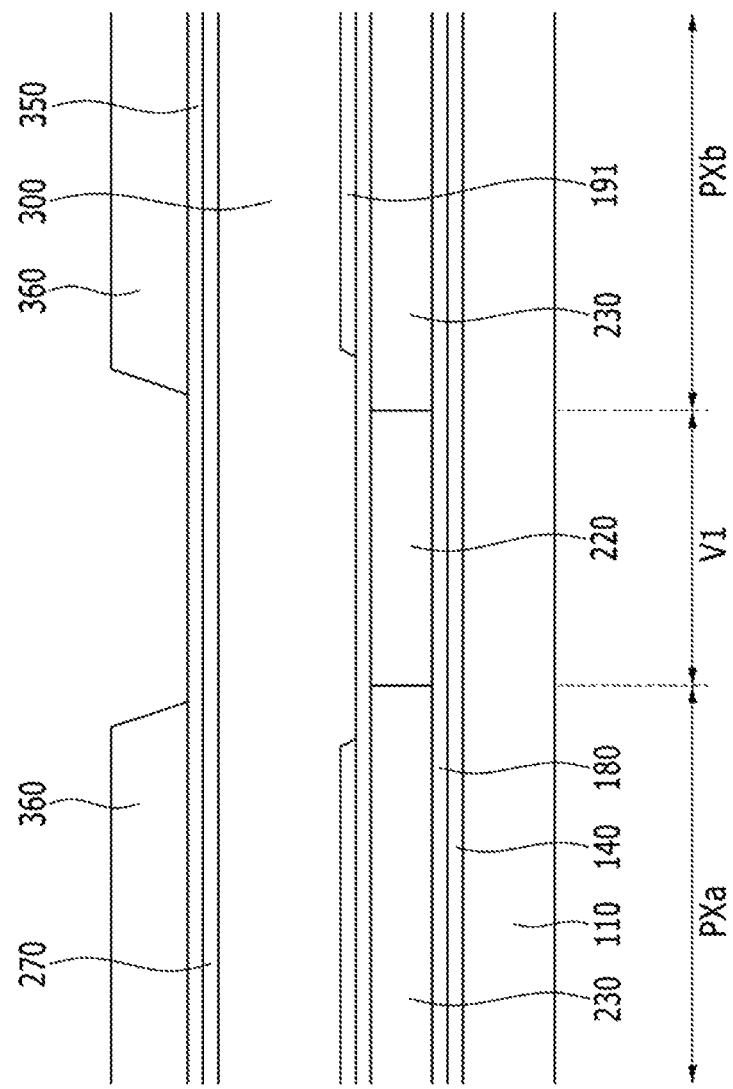

Next, the roof layer 360 is patterned. As shown in FIG. 14, the organic material located at the first valley V1 may be patterned so as to be removed. As a result, the roof layers 360 may be formed connected to each other along a plurality of pixel rows.

In the present exemplary embodiment, as shown in FIG. 1, the roof layer 360 is patterned so as to cover the display unit area and the common voltage line 172.

FIG. 14 illustrates a cross-section of the display device where the roof layer is patterned to form a groove at the first valley. As shown in FIG. 1, the roof layer 360 is patterned such that the roof layer 360 is not only formed in the display unit but also at the outer edge area of the display unit. In addition, the roof layer is patterned such that the roof layer is located at an upper surface of each pad portion, as shown in FIG. 1.

Figure 15:
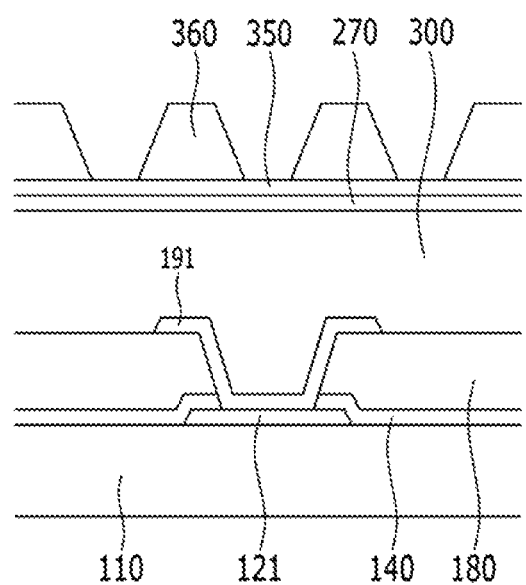

FIG. 15 illustrates a cross-section where the roof layer of the gate pad is patterned to form a groove. As shown in FIG. 15, the roof layer of the gate pad portion is patterned and thus the second insulating layer is partially exposed. Although FIG. 15 illustrates only the gate pad, it is understood that the shape of the patterned roof layer is also similar in the data pad and the exposure pad. In addition, the shape of the patterned roof layer is also similar in regions where other pads are formed in the display device.

Figure 16:
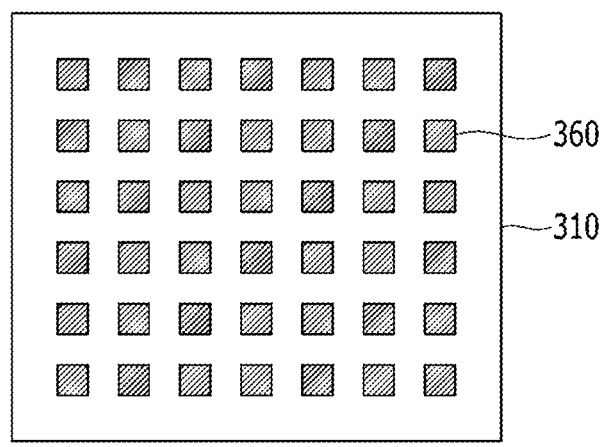
FIG. 16 to FIG. 22 illustrate various shapes of a roof layer patterned on a pad portion.
Figure 17:
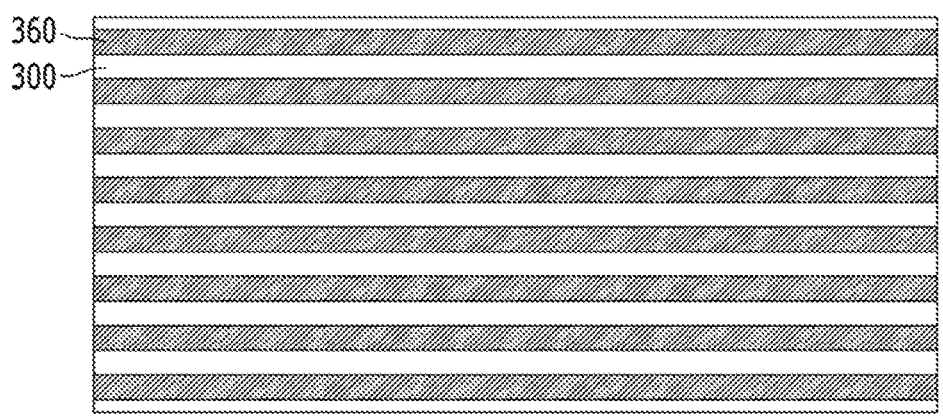
Figure 18:
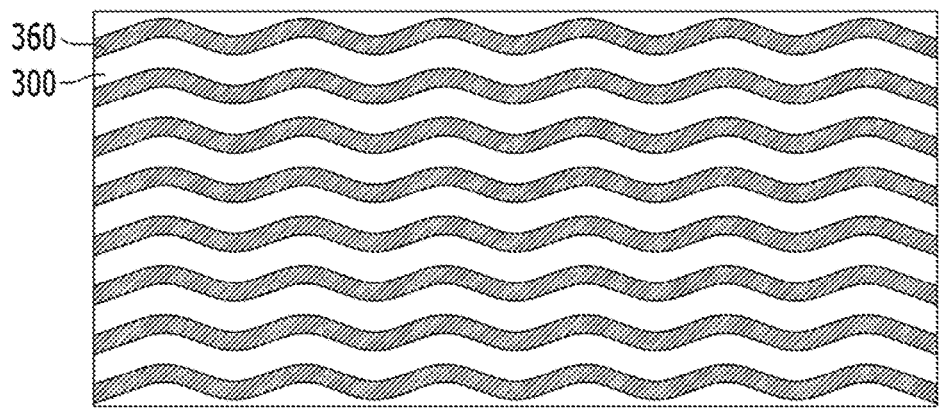
Figure 19:
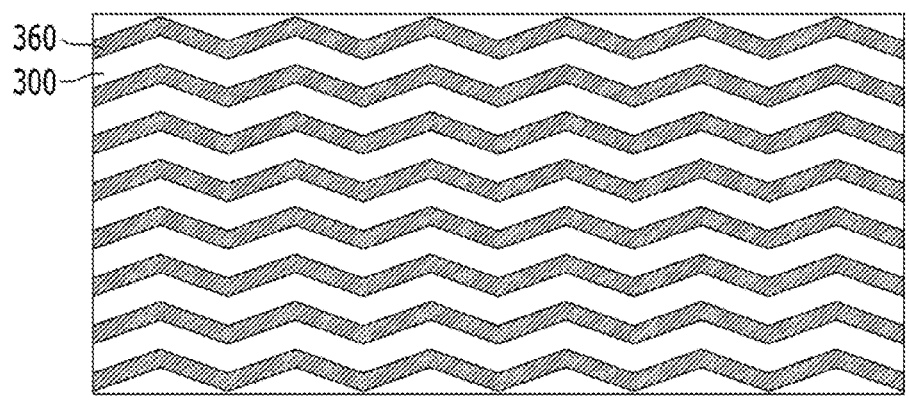
Figure 20:
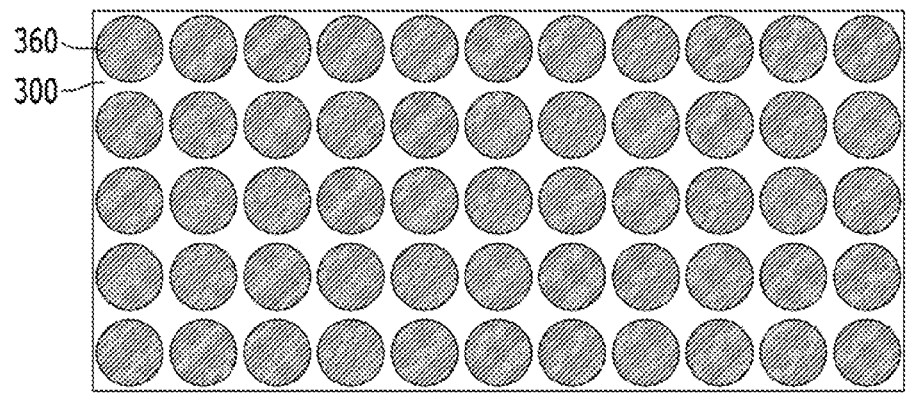
Figure 21:
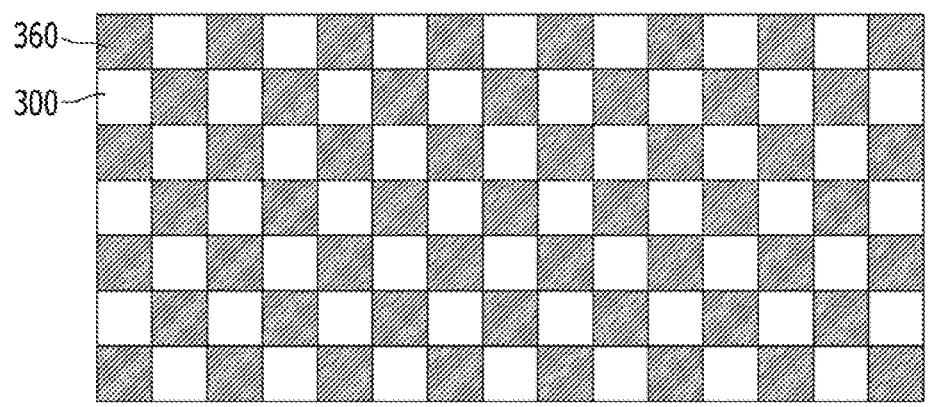
Figure 22:
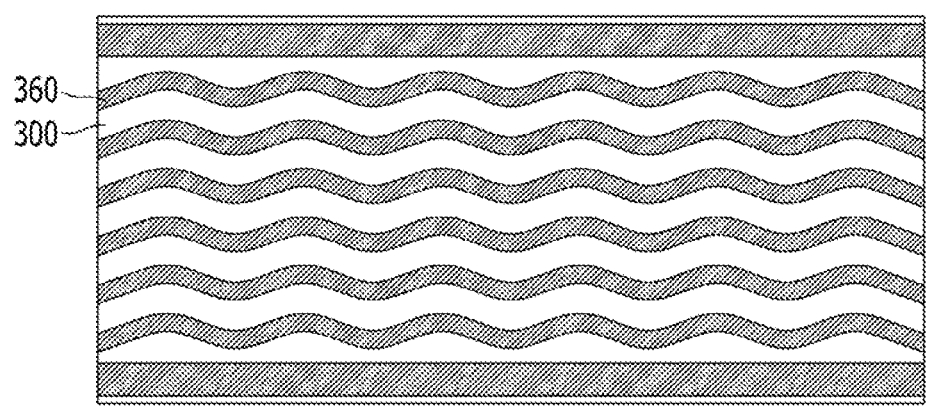

The shape of the roof layer patterned in the pad portion may vary. FIG. 16 to FIG. 22 illustrate various shapes of the roof layer patterned in the pad portion. As shown in FIG. 16, the shape of the roof layer patterned in the gate pad portion, the data pad portion, the exposure pad portion, or another pad portion may be a shape in which a plurality of quadrangles are concentrated. Alternatively, as shown in FIG. 17, the roof layer may be linearly shaped. As a further alternative, as shown in FIG. 18 to FIG. 22, the roof layer may be patterned having various shapes such as a wave shape, a circular shape, a shape having a mixture of waves, circles, and straight lines, a checkerboard shape, and the like. It should be noted that the shape patterned in the pad portion is not limited to the shape shown in FIG. 17 to FIG. 22.

The roof layer pattern of the display unit, the roof layer pattern of the pad portion, and the removal of the roof layer in a portion excluding the display unit, the peripheral area of the display unit, and the pad portion are performed (or formed) through a single process using a single mask. Thus, the roof layer of the pad portion can be patterned without requiring additional masks.

Figure 23:
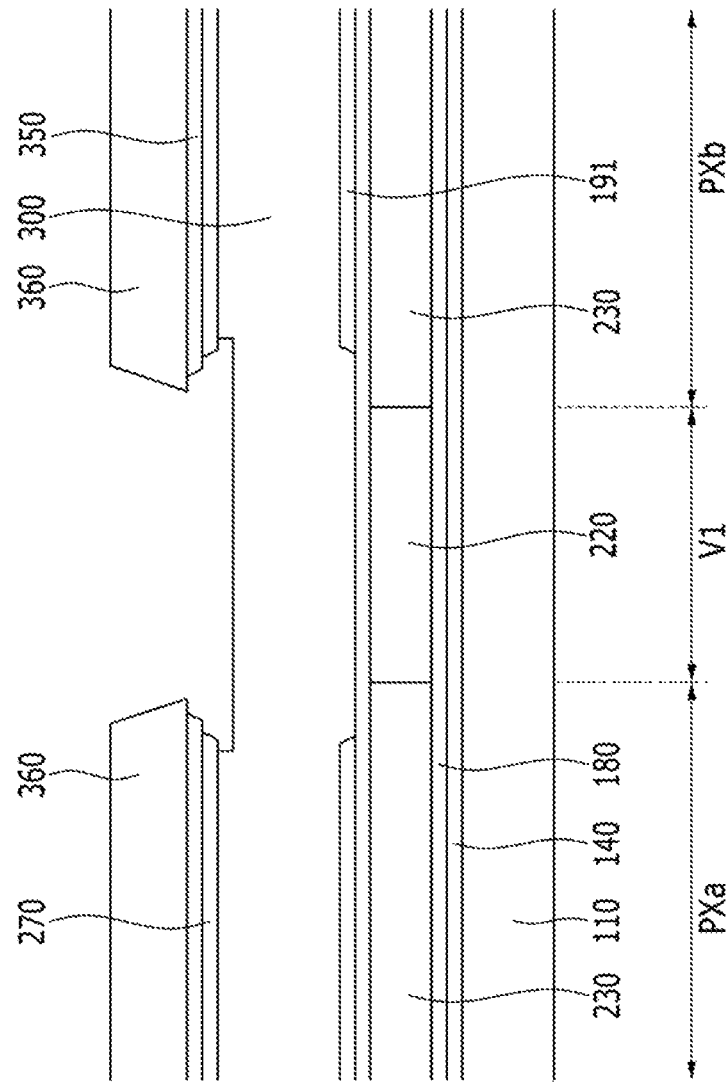

Next, as shown in FIG. 23, the second insulating layer 350 and the common electrode 270 are patterned using the roof layer 360 as a mask. After the second insulating layer 350 and the common electrode 270 are patterned, the sacrificial layer 300 is partially exposed so that an injection hole 307 is formed.

Figure 24:
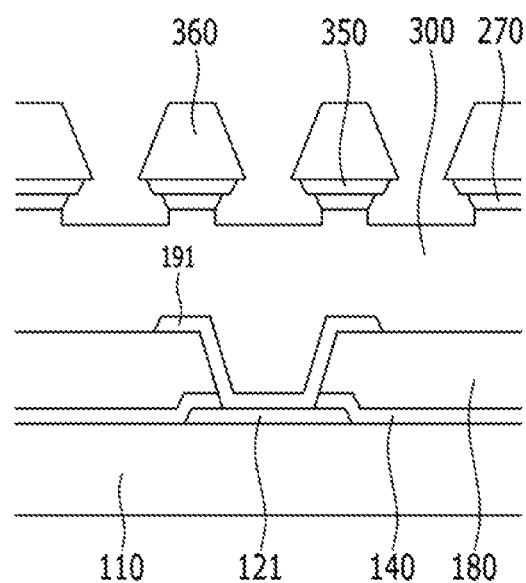

Similarly, as shown in FIG. 24, the second insulating layer 350 and the common electrode 270 are patterned using the roof layer 360 as a mask in the pad portion. After the roof layer 360, the second insulating layer 350, and the common electrode 270 are patterned, the sacrificial layer 300 is partially exposed so that the injection hole 307 is formed.

The patterning of the second insulating layer and the common electrode using the roof layer as a mask in the display unit and the pad portion can be performed through a single process.

Next, the sacrificial layer 300 disposed at the first valley V1 is partially removed by ashing the sacrificial layer 300. During the ashing process of the sacrificial layer 300, the second insulating layer 350 and a part of the common electrode 270 in a region adjacent to the injection hole 307 are removed. As a result, the patterns of the common electrode 270 and the second insulating layer 350 may be similar to the pattern of the roof layer 360. Alternatively, the patterns of the common electrode 270 and the second insulating layer 350 may be positioned on the inner side of the pattern of the roof layer 360. In this case, the edges of the common electrode 270 and the second insulating layer 350 may be formed having reverse tapered shapes.

Figure 25:
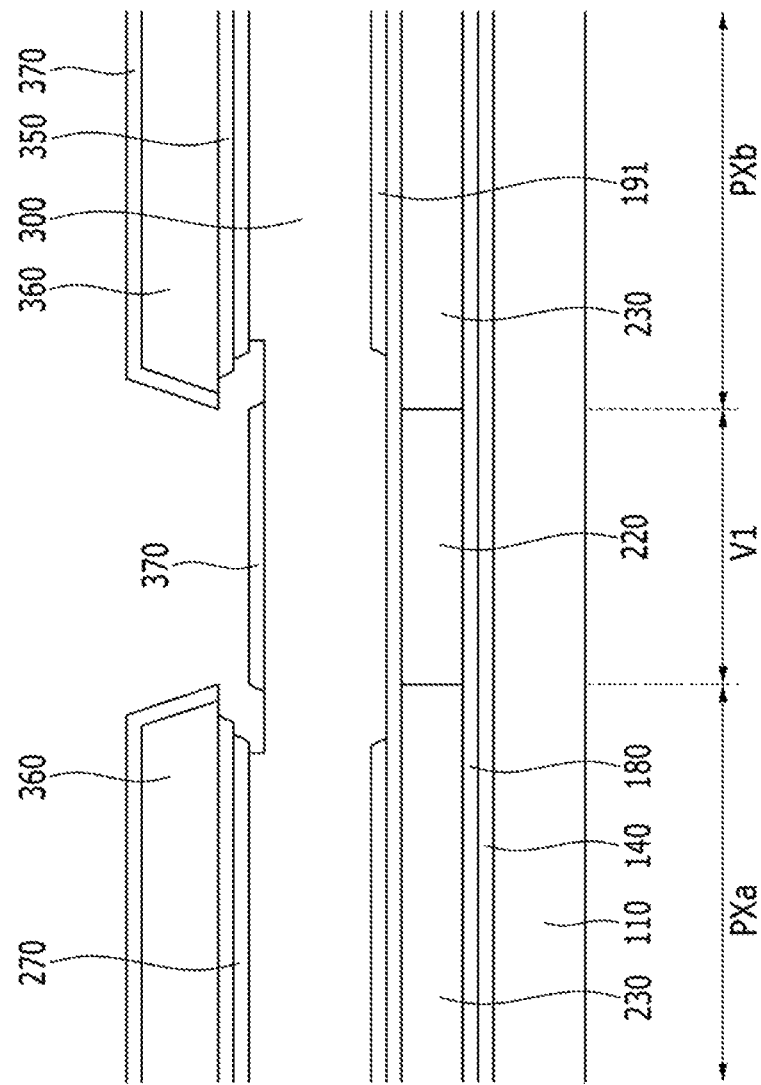
Figure 26:
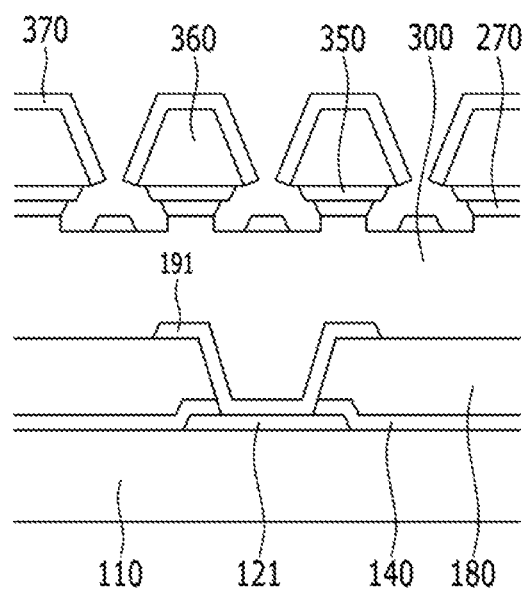

Next, as shown in FIG. 25 and FIG. 26, a third insulating layer 370 is formed on the roof layer 360. The third insulating layer 370 is made of an inorganic insulating material such as a silicon nitride (SiNx), a silicon oxide (SiOx), or a silicon oxynitride (SiOxNy). The third insulating layer 370 positioned at the first subpixel area PXa and the second subpixel area PXb is formed directly on the roof layer 360. The third insulating layer 370 positioned directly on the roof layer 360 is formed covering the upper surface and the side of the roof layer 360 so as to protect the roof layer 360. The third insulating layer 370 positioned at the first valley V1 is formed directly on the sacrificial layer 300.

The portion of the third insulating layer 370 positioned directly on the roof layer 360 and the portion of the third insulating layer 370 positioned directly on the sacrificial layer 300 are disconnected from each other. The edges of the second insulating layer 350 and the common electrode 270 which are positioned below the roof layer 360 are formed having a reverse tapered shape. As a result, the third insulating layer 370 is not supported but is disconnected at the edges of the second insulating layer 350 and the common electrode 270.

Figure 27:
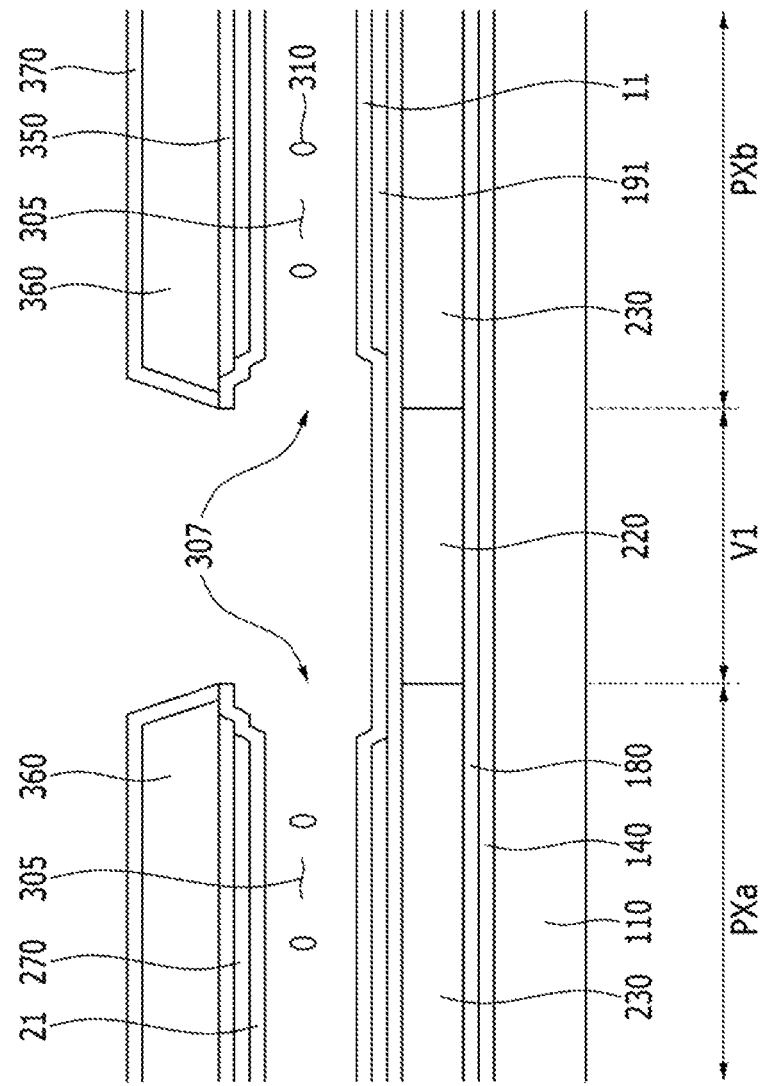

Next, as illustrated in FIG. 27, the sacrificial layer 300 is fully removed by applying a developer, a stripper solution, or the like through the disconnected portion of the third insulating layer 370, or by using an ashing process.

During the removing process of the sacrificial layer 300, the third insulating layer 370 disposed directly on the sacrificial layer 300 is lifted off. That is, when the sacrificial layer 300 is removed, the third insulating layer 370 disposed directly on the sacrificial layer 300 is also removed.

Figure 28:
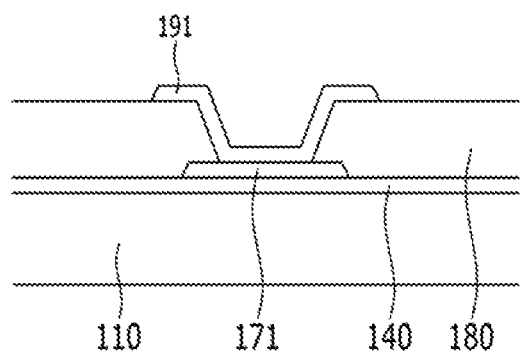

As shown in FIG. 28, the sacrificial layer 300 in the pad portion is removed in the same way that the sacrificial layer 300 in the display unit is removed. When the sacrificial layer 300 is removed, the third insulating layer 370 disposed on the sacrificial layer 300 is also removed. In addition, when the sacrificial layer 300 is removed, the second insulating layer 350 and the common electrode 270 located on the sacrificial layer 300 are also removed such that the pixel electrode 191 is exposed through the upper surface of the pad.

After the sacrificial layer 300 is removed, the microcavity 305 is formed in the space previously occupied by the sacrificial layer 300.

The pixel electrode 191 and the common electrode 270 are spaced apart from each other with the microcavity 305 disposed therebetween, and the pixel electrode 191 and the roof layer 360 are spaced apart from each other with the microcavity 305 disposed therebetween. The common electrode 270 and the roof layer 360 are formed covering the upper surface and both sides of the microcavity 305.

The microcavity 305 is exposed to the outside through an injection hole 307. The injection hole 307 corresponds to a portion where the roof layer 360, the second insulating layer 350, and the common electrode 270 are removed. The injection hole 307 is formed along the horizontal valley V1. For example, the injection holes 307 may be formed facing each other at the edges of the first subpixel area PXa and the second subpixel area PXb. That is, the injection holes 307 may correspond to the lower side surface of the first subpixel area PXa and the upper side surface of the second subpixel area PXb so as to expose the side of the microcavity 305. In some other embodiments, the injection hole 307 may also be formed along the vertical valley V2.

Next, the roof layer 360 is cured by applying heat to the substrate 110. The shape of the microcavity 305 is maintained by the cured roof layer 360.

When an aligning agent containing an alignment material is deposited on the substrate 110 by a spin coating method or an inkjet method, the aligning agent is injected into the microcavity 305 through the injection hole 307. When the aligning agent is injected into the microcavity 305 and then a curing process is performed, a solution component of the aligning agent is evaporated, and the alignment material remains on a wall surface in the microcavity 305.

Accordingly, the first alignment layer 11 may be formed on the pixel electrode 191, and the second alignment layer 21 may be formed below the lower insulating layer 350. The first alignment layer 11 and the second alignment layer 21 are formed facing each other with the space 305 disposed therebetween, and are connected to each other at the edge of the pixel area PX.

In the above embodiment, the first and second alignment layers 11 and 21 may be aligned in a direction perpendicular to the substrate 110, except at the side of the microcavity 305. In addition, by performing a process of irradiating UV light onto the first and second alignment layers 11 and 21, the first and second alignment layers 11 and 21 may be aligned in a direction parallel to the substrate 110.

Next, when the liquid crystal material comprising liquid crystal molecules 310 is deposited on the substrate 110 by an inkjet method or a dispensing method, the liquid crystal material is injected into the microcavity 305 through the injection hole 307. In the above embodiment, the liquid crystal material may be deposited only in an injection hole 307 formed along the odd-numbered first valleys V1, and may not be deposited in an injection hole 307 formed along the even-numbered first valley V1. In some other embodiments, a liquid crystal material may be deposited only in an injection hole 307 formed along the even-numbered first valleys V1, and may not be deposited in an injection hole 307 formed along the odd-numbered first valley V1.

When the liquid crystal material is deposited in the injection holes 307 formed along the odd-numbered first valleys V1, the liquid crystal material passes through the injection hole 307 by capillary force to be injected into the microcavity 305. In the above embodiment, the liquid crystal material is injected into the microcavity 305 by discharging air in the microcavity 305 through the injection hole 307 formed along the even-numbered first valleys V1.

Alternatively, the liquid crystal material may be deposited in all the injection holes 307. That is, the liquid crystal material may be deposited in the injection holes 307 formed along the odd-numbered first valleys V1 and also the injection holes 307 formed along the even-numbered first valleys V1.

Figure 29:
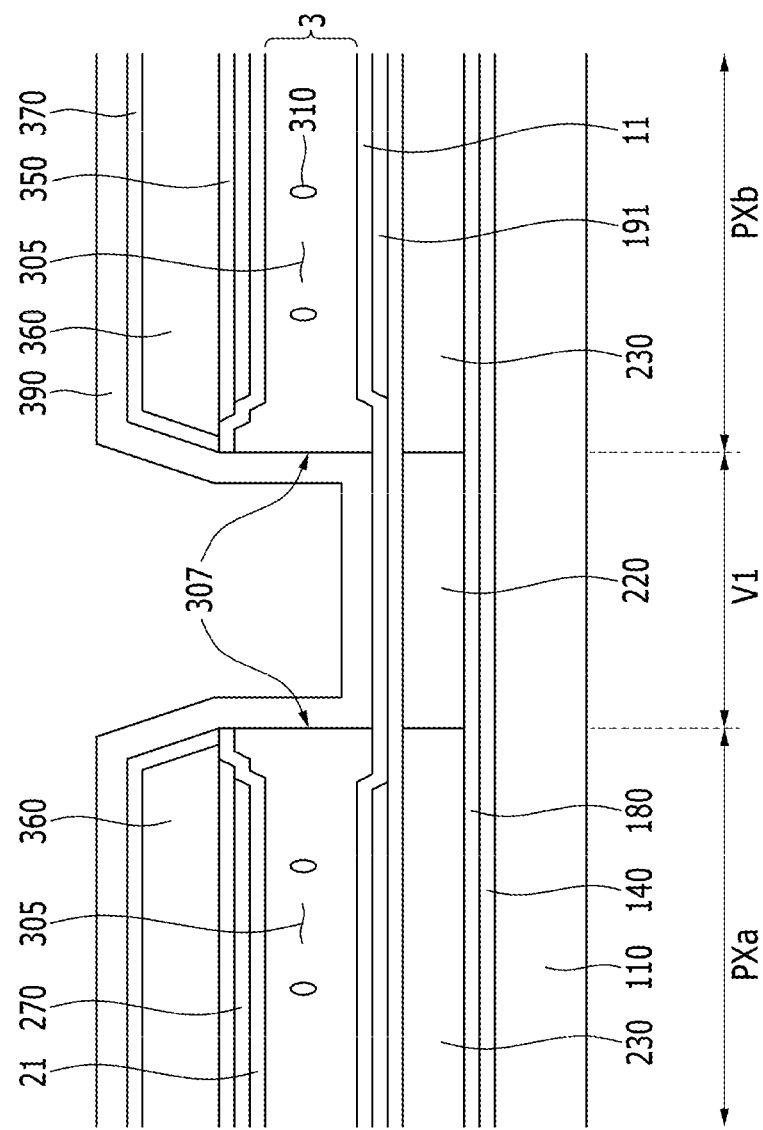

As shown in FIG. 29, an overcoat 390 is formed by depositing a material which does not react with the liquid crystal molecules 310 on the roof layer 360. The overcoat 390 is formed covering the injection hole 307 (where the microcavity 305 is exposed to the outside) so as to seal the microcavity 305.

Next, although not illustrated, polarizers may be further attached onto the upper and lower surfaces of the display device. The polarizers may include a first polarizer and a second polarizer. The first polarizer may be attached onto the lower surface of the substrate 110, and the second polarizer may be attached onto the overcoat 390.

According to the exemplary manufacturing method of the display device described above, the roof layer pattern is formed in the upper surface of the pad portion at the same time when forming the roof layer in the display unit. As a result, the unnecessary structures (e.g., the sacrificial layer, the common electrode, and the second insulating layer) on the pad portion can be removed in the same step when removing those structures from the display unit.

Accordingly, no additional process for exposure of the pixel electrode in the pad portion is required in the above embodiment.

In addition, in the exemplary manufacturing method of the display device, the second insulating layer and the common electrode are etched using the roof layer as a mask and therefore the number of masks can be reduced. Furthermore, the roof layer is formed covering the common voltage line 172 and the common voltage line contact hole at the outer edge of the display unit so that a short circuit of the common electrode can be prevented.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising: a substrate;
   a common voltage line on a display unit and at an outer side of the display unit, wherein the display unit is on the substrate and includes a plurality of pixel areas;
   a thin film transistor disposed on the display unit;
   a pixel electrode connected to the thin film transistor;
   a common electrode disposed spaced apart from the pixel electrode;
   a liquid crystal layer disposed in a plurality of microcavities between the pixel electrode and the common electrode; and
   a roof layer disposed on the common electrode,
   wherein the common electrode contacts the common voltage line at the outer side of the display unit through a contact hole,
   wherein the roof layer is disposed covering the contact hole.

2. The display device of claim 1, wherein a pattern of the common electrode is either the same as a pattern of the roof layer or located inside the pattern of the roof layer.

3. The display device of claim 1, wherein one or more pads connected with a data line or a gate line of the display unit is located in an area of the substrate where the display unit is formed, and an electrode is exposed to an upper surface of the one or more pads.

4. The display device of claim 1, wherein the common electrode is a shape of an inverse taper.

5. The display device of claim 1, further comprising a first insulating layer disposed on the thin film transistor and a second insulating layer disposed on the common electrode, wherein a pattern of the second insulating layer is either the same as a pattern of the roof layer or located inside the pattern of the roof layer.

6. The display device of claim 5, wherein the second insulating layer is a shape of an inverse taper.

7. The display device of claim 3, wherein a pixel electrode is located in an uppermost surface of the one or more pads.

8. The display device of claim 1, further comprising a third insulating layer disposed on the roof layer.

9. The display device of claim 8, wherein a pattern of the common electrode is located inside a pattern of the third insulating layer.

10. The display device of claim 9, wherein a pattern of the second insulating layer is located inside the pattern of the third insulating layer.

11. The display device of claim 3, wherein the one or more pads are not covered by the roof layer.

* * * * *